(12) United States Patent
Lee et al.

(10) Patent No.: US 11,856,772 B2
(45) Date of Patent: Dec. 26, 2023

(54) NONVOLATILE MEMORY DEVICE AND METHOD OF FABRICATING SAME

(71) Applicant: SAMSUNG ELECTRONICS CO., LTD., Suwon-si (KR)

(72) Inventors: Seung Won Lee, Hwaseong-si (KR); Tae Hun Kim, Gwacheon-si (KR); Min Cheol Park, Seoul (KR); Hye Ri Shin, Seoul (KR); Jun Hee Lim, Seoul (KR); Si Yeon Cho, Hwaseong-si (KR)

(73) Assignee: Samsung Electronics Co., Ltd.

( * ) Notice: Subject to any disclaimer, the term of this patent is extended or adjusted under 35 U.S.C. 154(b) by 320 days.

(21) Appl. No.: 16/930,381

(22) Filed: Jul. 16, 2020

(65) Prior Publication Data

US 2021/0233929 A1 Jul. 29, 2021

(30) Foreign Application Priority Data

Jan. 28, 2020 (KR) .................. 10-2020-0009778

(51) Int. Cl.
*H01L 27/115* (2017.01)
*H10B 43/27* (2023.01)
*G11C 8/14* (2006.01)
*G11C 7/18* (2006.01)

(52) U.S. Cl.
CPC .............. *H10B 43/27* (2023.02); *G11C 7/18* (2013.01); *G11C 8/14* (2013.01)

(58) Field of Classification Search
CPC ......... H01L 27/11582; H01L 27/11556; H01L 27/1157; H01L 27/11565; H01L 27/11573; H10B 43/27; H10B 43/10; H10B 43/20; H10B 43/35; H10B 41/27
See application file for complete search history.

(56) References Cited

U.S. PATENT DOCUMENTS

| 9,711,532 | B2 | 7/2017 | Miyamoto et al. |
| 10,199,359 | B1 * | 2/2019 | Sakakibara ............ H05K 7/023 |
| 2016/0268283 | A1 | 9/2016 | Kitamura et al. |

(Continued)

FOREIGN PATENT DOCUMENTS

| JP | 2018142654 A2 | 9/2018 |
| KR | 1014854 B1 | 2/2011 |

(Continued)

*Primary Examiner* — Tony Tran
(74) *Attorney, Agent, or Firm* — Fish & Richardson P.C.

(57) ABSTRACT

A nonvolatile memory device and method of fabricating same, the nonvolatile memory device including a substrate; a first semiconductor layer on the substrate; an etching stop film including a metal oxide on the first semiconductor layer; a mold structure including second semiconductor layers and insulating layers alternately stacked on the etching stop film; a channel hole penetrating through at least one of the mold structure, the etching stop film, the second semiconductor layer and the substrate; and a channel structure extending along a side wall of the channel hole, including an anti-oxidant film, a first blocking insulation film, a second blocking insulation film, a charge storage film, a tunnel insulating film and a channel semiconductor sequentially formed along the side wall of the channel hole. The first semiconductor layer contacts the first blocking insulation film, the second blocking insulation film, the charge storage film, and the tunnel insulating film.

18 Claims, 28 Drawing Sheets

(56) References Cited

U.S. PATENT DOCUMENTS

2018/0026050 A1* 1/2018 Lee .................... H01L 27/1157
257/314
2018/0337195 A1 11/2018 Jayanti et al.

FOREIGN PATENT DOCUMENTS

KR        20180133742 A     12/2018
KR        20190058079 A      5/2019

* cited by examiner

NONVOLATILE MEMORY DEVICE AND METHOD OF FABRICATING SAME

This application claims priority under 35 U.S.C. § 119 to Korean Patent Application No. 10-2020-0009778 filed on Jan. 28, 2020, the subject matter of which is hereby incorporated by reference.

BACKGROUND

1. Field of the Invention

The inventive concept relates generally to nonvolatile memory devices and methods of fabricating same.

2. Explanation of the Related Art

A semiconductor memory device may be broadly classified as a volatile memory device or a nonvolatile memory device.

Increasing integration density in the layout and fabrication of nonvolatile memory devices is driven by customer expectations for superior performance and low price. For two-dimensional or planar memory devices, the degree of overall device integration is limited by the area occupied by a unit memory cell. However, three-dimensional memory devices may vertically stack unit memory cells or material layers including unit memory cells.

SUMMARY

Embodiments of the inventive concept provide nonvolatile memory devices having increased integration density and improved operating reliability.

Embodiments of the inventive concept provide methods of fabricating nonvolatile memory devices having increased integration density and improved operating reliability.

However, the inventive concept is not limited to only these aspects, and additional aspects of the inventive concept will become apparent upon consideration of certain illustrated embodiments of the inventive concept with reference to the following detailed description and accompanying drawings.

According to an aspect of the inventive concept, there is provided a nonvolatile memory device including; a substrate, a first semiconductor layer on the substrate, an etching stop film including a metal oxide on the first semiconductor layer, a mold structure on which a second semiconductor layer and an insulating layer are alternately stacked on the etching stop film, a channel hole which penetrates at least one of the mold structure, the etching stop film, the second semiconductor layer and the substrate, and a channel structure which extends along a side wall of the channel hole, and includes an anti-oxidant film, a first blocking insulation film, a second blocking insulation film, a charge storage film, a tunnel insulating film and a channel semiconductor which are sequentially formed along the side wall of the channel hole. The first semiconductor layer contacts the first blocking insulation film, the second blocking insulation film, the charge storage film, and the tunnel insulating film.

According to an aspect of the inventive concept, there is provided a nonvolatile memory device including; a substrate, a first semiconductor layer on the substrate, an etching stop film including a metal oxide on the first semiconductor layer, a mold structure on which a second semiconductor layer and an insulating layer are alternately stacked on the etching stop film, a common source line which penetrates the mold structure, the etching stop film and the first semiconductor layer, a channel hole which penetrates at least one of the mold structure, the etching stop film, the first semiconductor layer and the substrate, and a channel structure which extends along a side wall of the channel hole, and includes an anti-oxidant film, a first blocking insulation film, a second blocking insulation film, a charge storage film, a tunnel insulating film and a channel semiconductor sequentially formed along the side wall of the channel hole. The common source line is electrically connected to the channel semiconductor through the substrate and the first semiconductor layer.

According to an aspect of the inventive concept, there is provided a nonvolatile memory device including; a substrate, a first semiconductor layer on the substrate, an etching stop film including a metal oxide on the first semiconductor layer, a mold structure on which a second semiconductor layer and an insulating layer are alternately stacked on the etching stop film, a common source line which penetrates the mold structure, the etching stop film and the first semiconductor layer, a channel hole which penetrates at least one of the mold structure, the etching stop film, the second semiconductor layer and the substrate, a channel structure which extends along a side wall of the channel hole, includes an anti-oxidant film, a first blocking insulation film, a second blocking insulation film, a charge storage film, a tunnel insulating film, a channel semiconductor and a filling pattern which are sequentially formed along the side wall of the channel hole, and includes a channel pad on the channel semiconductor and the filling pattern, an insulating spacer formed between the mold structure and the common source line, between the etching stop film and the common source line, and between the first semiconductor layer and the common source line, a bit line contact electrically connected to the channel pad, an interlayer insulating film which surrounds the bit line contact, and a bit line disposed on the interlayer insulating film and electrically connected to the bit line contact. The first semiconductor layer penetrates the first blocking insulation film, the second blocking insulation film, the charge storage film, and the tunnel insulating film and is electrically connected to the channel semiconductor.

According to an aspect of the inventive concept, there is provided a method of fabricating a nonvolatile memory device. The method includes; sequentially stacking a first sacrificial insulating layer, a sacrificial semiconductor layer and a second sacrificial insulating layer on a substrate, forming an etching stop film including a metal oxide on the second sacrificial insulating layer, alternately stacking a first semiconductor layer and an insulating layer on the etching stop film to form a mold structure, forming a channel hole which penetrates at least one of the mold structure, the etching stop film, the first sacrificial insulating layer, the sacrificial semiconductor layer, the second sacrificial insulating layer and the substrate, sequentially forming an anti-oxidant film, a first blocking insulation film, a second blocking insulation film, a charge storage film, a tunnel insulating film and a channel semiconductor along a side wall of the channel hole, filling a filling pattern in the channel semiconductor, and forming a channel pad on the channel semiconductor and the filling pattern to form a channel structure, forming a word line cut region penetrating the mold structure, a lowermost part of the word line cut region being formed to meet the etching stop film, forming an insulating pattern along a side wall of the word line cut region, etching the insulating pattern, the etching stop film, the second sacrificial insulating layer and the sacrificial semiconductor layer to expose part of the first sacrificial insulating layer, removing the sacrificial semiconductor layer to expose part of the anti-oxidant film, etching part of the anti-oxidation film, part of the first blocking insulation film and part of the second blocking insulation film, oxidizing the insulating pattern to form a sacrificial insulating spacer along a side wall of the insulating pattern, removing part of the charge storage film, removing the first sacrificial insulating layer, the second sacrificial insulating layer and the sacrificial insulating spacer, forming a second semiconductor layer in a region from which the first sacrificial insulating layer, the sacrificial semiconductor layer, the second sacrificial insulating layer, part of the anti-oxidant film, part of the first blocking insulation film, part of the second blocking insulation film, and part of the charge storage film are removed, etching the second semiconductor layer to expose a region in which the substrate overlaps a lowermost part of the word line cut region, oxidizing the insulating pattern to form an insulating spacer, and filling a conductive material inside the word line cut region and on an exposed region of the substrate to form a common source line.

According to an aspect of the inventive concept, there is provided a method of fabricating a nonvolatile memory device. The method includes; sequentially stacking a first sacrificial insulating layer, a sacrificial semiconductor layer and a second sacrificial insulating layer on a substrate, forming an etching stop film including a metal oxide on the second sacrificial insulating layer, alternately stacking a first semiconductor layer and an insulating layer on the etching stop film to form a mold structure, forming a channel hole which penetrates through at least one of the mold structure, the etching stop film, the first sacrificial insulating layer, the sacrificial semiconductor layer, the second sacrificial insulating layer and the substrate, sequentially forming an anti-oxidant film, a first blocking insulation film, a second blocking insulation film, a charge storage film, a tunnel insulating film and a channel semiconductor along a side wall of the channel hole, filling a filling pattern in the channel semiconductor, and forming a channel pad on the channel semiconductor and the filling pattern to form a channel structure, forming a word line cut region penetrating the mold structure, a lowermost part of the word line cut region being formed to meet the etching stop film, forming a spacer semiconductor pattern along a side wall of the word line cut region, etching the spacer semiconductor pattern, the etching stop film, the second sacrificial insulating layer and the sacrificial semiconductor layer to expose part of the first sacrificial insulating layer, removing the sacrificial semiconductor layer to expose part of the anti-oxidant film, removing part of the anti-oxidant film, part of the first blocking insulation film, part of the second blocking insulation film, part of the charge storage film, part of the tunnel insulating film, the first sacrificial insulating layer and the second sacrificial insulating layer, forming a second semiconductor layer in a region from which part of the anti-oxidant film, part of the first blocking insulation film, part of the second blocking insulation film, part of the charge storage film, part of the tunnel insulating film, the first sacrificial insulating layer and the second sacrificial insulating layer are removed, etching the second semiconductor layer to expose a region in which the substrate overlaps a lowermost part of the word line cut region, oxidizing the spacer semiconductor pattern to form an insulating spacer, and filling a conductive material inside the word line cut region and on an exposed region of the substrate to form a common source line.

According to an aspect of the inventive concept, there is provided a nonvolatile memory device including; an N-type doped semiconductor layer disposed on a semiconductor substrate, an etching stop film including a metal oxide disposed on the N-type semiconductor layer and serving as an etching stop during a formation of a word line cut region, a mold structure disposed on the etching stop film, a channel structure extending through the mold structure and etching stop film, and contacting the N-type doped semiconductor layer, and an interlayer insulating film covering an upper surface of the channel structure and an upper surface of the mold structure. The channel structure includes; an anti-oxidation film disposed on outer sidewalls of the channel structure, a first blocking insulation film disposed on the anti-oxidation film, a second blocking insulation film disposed on the first blocking film, a charge storage film disposed on the second blocking insulation film, a tunnel insulating film disposed on the charge storage film, and a channel semiconductor disposed on the charge storage film, and the mold structure includes a sequentially stacked arrangement of a P-type doped semiconductor layer and an insulating layer.

BRIEF DESCRIPTION OF THE DRAWINGS

Certain embodiments of the inventive concept will be described in some additional detail hereafter with reference to the accompanying drawings, in which.

Throughout the written description and drawings, like reference numbers and labels are used to denote like or similar elements, materials and/or features.

DETAILED DESCRIPTION

Throughout the written description certain geometric terms may be used to highlight certain relative relationships between elements, components and/or features with respect to certain embodiments of the inventive concept. Those skilled in the art will recognize that such geometric terms are relative in nature, arbitrary in descriptive relation and/or directed to aspect(s) of the illustrated embodiments. Geometric terms may include, for example: height/width; vertical/horizontal; closer/farther; thicker/thinner; proximate/distant; above/below; under/over; upper/lower; uppermost/ lowermost; center/edge; surround; periphery; overlap/underlay; beside; parallel, etc.

Figure 1:
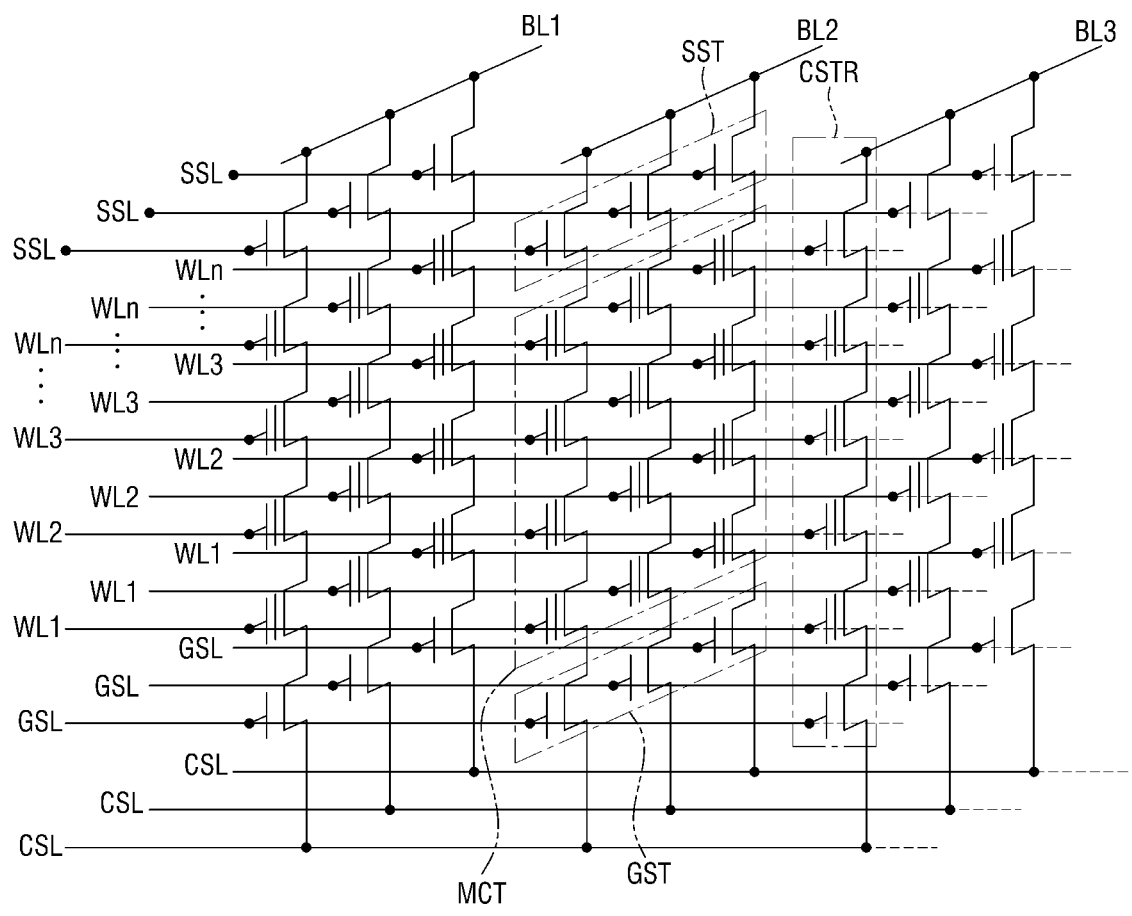
FIG. 1 is a circuit diagram illustrating a nonvolatile memory device according to embodiments of the inventive concept.

FIG. 1 is a circuit diagram illustrating a nonvolatile memory device according to embodiments of the inventive concept.

Referring to FIG. 1, a memory cell array of a nonvolatile memory device according to some embodiments may include a common source line CSL, bit lines BL1 to BL3, and cell strings CSTR.

The bit lines BL1 to BL3 may have a two-dimensionally arrangement. For example, each of the bit lines BL1 to BL3 may extend in the first direction X, and be spaced apart from each other in a second direction Y. The cell strings CSTR may be respectively connected to the bit lines BL1 to BL3 in parallel.

The cell strings CSTR may be commonly connected to the common source line CSL. That is, the cell strings CSTR may be placed between each of the bit lines BL1 to BL3 and the common source line CSL. In some embodiments, the common source lines CSL may be arranged two-dimensionally.

For example, each of the common source lines CSL may be spaced apart from each other in the first direction X and may extend in the second direction Y. The same voltage may be electrically applied to the common source lines CSL or different voltages from each other may be applied to the common source line CSL to be separately controlled.

Each cell string CSTR may include a ground selection transistor GST connected to the common source line CSL, a string selection transistor SST connected to each of the bit lines BL1 to BL3, and memory cell transistors MCT disposed between the ground selection transistor GST and the string selection transistor SST. Each memory cell transistor MCT may include a data storage element. The ground selection transistor GST, the string selection transistor SST and the memory cell transistors MCT may be connected in series.

The common source line CSL may be commonly connected to the sources of the ground selection transistor GST. Further, gate electrodes (e.g., a ground selection line GSL, word lines WL1 to WLn and a string selection line SSL) may be placed between the common source line CSL and each of the bit lines BL1 to BL3.

The ground select line GSL may be used as a gate electrode of the ground selection transistor GST, the word lines WL1 to WLn may be used as gate electrodes of the memory cell transistors MCT, and the string selection line SSL may be used as a gate electrode of the string selection transistor SST.

Figure 2:
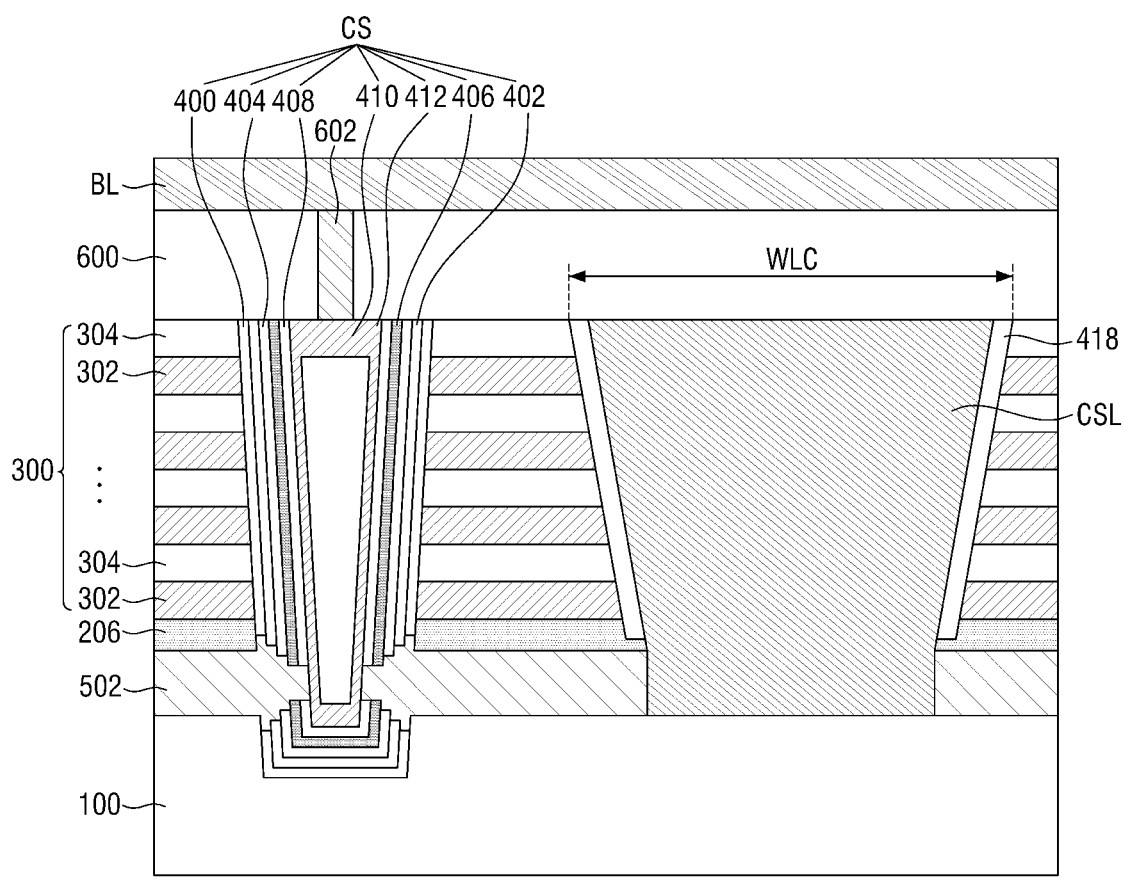
FIG. 2 is a cross-sectional diagram illustrating a nonvolatile memory device according to embodiments of the inventive concept.

FIG. 2 is a cross-sectional diagram illustrating a nonvolatile memory device according to embodiments of the inventive concept.

Referring to FIG. 2, the nonvolatile memory device includes a substrate 100, a first semiconductor layer 502, an etching stop film 206, a mold structure 300, a channel structure CS, an interlayer insulating film 600, a bit line contact 602, a bit line BL, and a common source line CSL.

The substrate 100 may include, for example, a semiconductor substrate such as a silicon substrate, a germanium substrate or a silicon-germanium substrate. Alternatively, the substrate 100 may include a silicon-on-insulator (SOI) substrate, a germanium-on-insulator (GOI) substrate or the like.

The nonvolatile memory device may also include a common source plate (not shown in FIG. 2) contacting the channel structure CS (e.g., an anti-oxidant film 400) between the first semiconductor layer 502 and the substrate 100. The common source line plate (not shown in FIG. 2) may include tungsten silicide (WSi).

A first semiconductor layer 502, an etching stop film 206, and a mold structure 300 may be sequentially stacked on the substrate 100. The channel structure CS may penetrate at least one of the mold structure 300, the etching stop film 206, the first semiconductor layer 502, and the substrate 100.

The first semiconductor layer 502 on the substrate 100 may include N-type doped polysilicon. The first semiconductor layer 502 may be electrically connected to a channel structure CS (e.g., a channel semiconductor 412).

The etching stop film 206 on the first semiconductor layer 502 may include a metal oxide. The metal oxide may include hafnium oxide ($HfO_2$). The etching stop film 206 may serve as an etch-stop for the an etching step used to form a word line cut region WLC at 206 during a fabrication process of a nonvolatile memory device according to embodiments of the inventive concept (See, e.g., FIG. 6).

A mold structure 300 may be formed on the etching stop film 206. The mold structure 300 may include a second semiconductor layer 302 and an insulating layer 304 sequentially stacked on the etching stop film 206.

The second semiconductor layer 302 may include polysilicon. Depending on the nature of the nonvolatile memory device, the second semiconductor layer 302 may be N-type doped polysilicon or P-type doped polysilicon. When the second semiconductor layer 302 is formed of P-type doped polysilicon, it is possible to relatively reduce a phenomenon in which electrical charge tunnel between the channel structure CS (e.g., the charge storage film 406) and the second semiconductor layer 302, as compared to a case where the second semiconductor layer 302 is formed of N-type doped polysilicon.

The insulating layer 304 may include an insulating material. For example, the insulating layer 304 may include, but is not limited to, silicon oxide.

The channel structure CS may be formed by forming an anti-oxidation film 400, a first blocking insulation film 402, a second blocking insulation film 404, a charge storage film 406, a tunnel insulating film 408, and a channel semiconductor 412 along a side wall of the channel hole penetrating at least one of the mold structure 300, the etching stop film 206, the first semiconductor layer 502 and the substrate 100 during the fabrication of the nonvolatile memory device. (See, e.g., FIG. 4).

In some embodiments, the channel structure CS may further include a channel pad 410 on the top. An internal space may be formed in the channel structure CS by the channel pad 410 and the channel semiconductor 412, and the internal space may include a filling pattern. The filling pattern may include, but is not limited to, silicon oxide.

Although the channel structure CS is illustrated as having a cup shape, the inventive concept is not limited thereto and the channel structure CS may have various shapes, such as a cylindrical shape, a quadrangular barrel shape, a solid filler shape, etc.

The mold structure 300 used during the fabrication process of the nonvolatile memory device may include a second semiconductor layer 302 and an insulating layer 304 that are sequentially stacked. Thus, in order to form the gate electrodes (e.g., the ground selection line GSL, the word lines WL1 to WLn and the string selection line SSL of FIG. 1), there is no need to additionally fill a conductive material at the position of the second semiconductor layer 302.

During the fabrication process, since there is no need for process(es) (e.g., a word line replacement) used to remove a sacrificial film at the position of the second semiconductor layer 302, and/or fill the conductive material in order to form the gate electrodes, it is possible to simplify the overall process.

The nonvolatile memory device may further include a common source line CSL that penetrates through the mold structure 300, the etching stop film 206, and the first semiconductor layer 502.

The common source line CSL in some embodiments may be made of a conductive material. The conductive material may be made of, but is not limited to, a metal material such as tungsten (W), aluminum (Al) or copper (Cu).

An insulating spacer 418 may be formed between the common source line CSL and the mold structure 300. Alternatively, the insulating spacer 418 may be formed between the common source line CSL and the mold structure 300, and between the common source line CSL and the etching stop film 206. The insulating spacer 418 may be a silicon nitride oxide (SiON) film formed by oxidizing an insulating pattern 414 (See, e.g., FIG. 6). Although not shown in FIG. 2, the insulating spacer 418 may include a plurality of spacer layers including a silicon nitride (SiN) film and a silicon nitride oxide (SiON) film. However, the insulating spacer 418 is not limited thereto.

The common source voltage of the conductive common source line CSL of the nonvolatile memory device may be transferred to a channel structure (e.g., a channel semiconductor 412) with low resistance through the first semiconductor layer 502. Therefore, the common source voltage may be efficiently transferred from the common source line CSL to the channel structure.

The channel structure of the nonvolatile memory device may be electrically connected to the bit line BL through the bit line contact 602. The bit line contact 602 and the bit line BL may be formed of one or more conductive material(s), such as tungsten (W), aluminum (Al) and/or copper (Cu).

The nonvolatile memory device may include an interlayer insulating film 600, where the interlayer insulating film 600 at least partially surrounds the bit line contact 602, and may be formed on the mold structure 300, the channel structure CS, and the word line cut region WLC. The interlayer insulating film 600 may include, for example, one or more of a high density plasma (HDP) oxide film and/or TEOS (TetraEthylOrthoSilicate). Further, the interlayer insulating film 130 may include, for example, silicon nitride, silicon oxynitride and/or a low-k material having a low dielectric constant.

FIGS. 3 to 15 are related, cross-sectional diagrams illustrating one example of a method of fabricating the nonvolatile memory device of FIG. 2 according to embodiments of the inventive concept.

Figure 3:
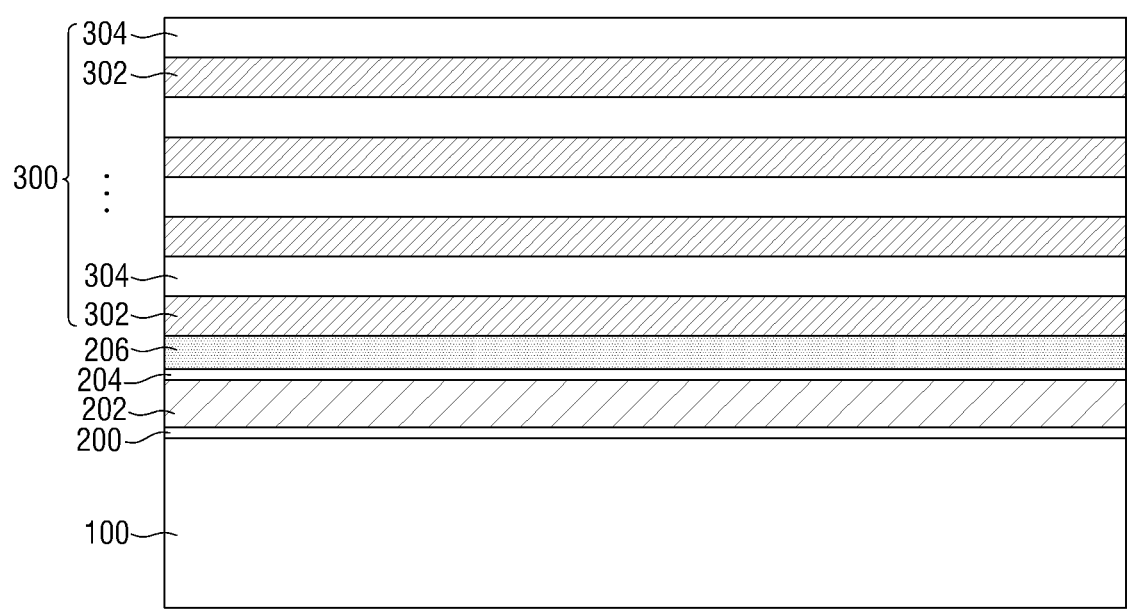
FIGS. 3, 4, 5, 6, 7, 8, 9, 10, 11, 12, 13, 14 and 15 (hereafter collectively, "FIGS. 3 to 15") are related, cross-sectional diagrams illustrating one example of a method of fabricating the nonvolatile memory device of FIG. 2 according to embodiments of the inventive concept.
Figure 3:
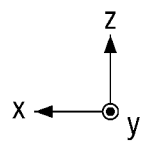

Referring to FIG. 3, a first sacrificial insulating layer 200, a sacrificial semiconductor layer 202, and a second sacrificial insulating layer 204 are formed on the substrate 100. The first sacrificial insulating layer 200 and the second sacrificial insulating layer 204 may include an insulating material. For example, the first sacrificial insulating layer 200 and the second sacrificial insulating layer 204 may include, but are not limited to, silicon oxide.

An etching stop film 206 is formed on the sacrificial semiconductor layer 202. The sacrificial semiconductor layer 202 may be N-type doped polysilicon. The etching stop films 206 may include metal oxide. The metal oxide may include hafnium oxide ($HfO_2$). The etching stop film 206 may serve as an etching stop for an etching process used to form a word line cut region WLC at 206 during the fabrication process of the nonvolatile memory device (See, e.g., FIG. 6).

Thereafter, a second semiconductor layer 302 and an insulating layer 304 are alternately stacked on the etching stop film 206 in a third direction Z to form a mold structure 300.

Figure 4:
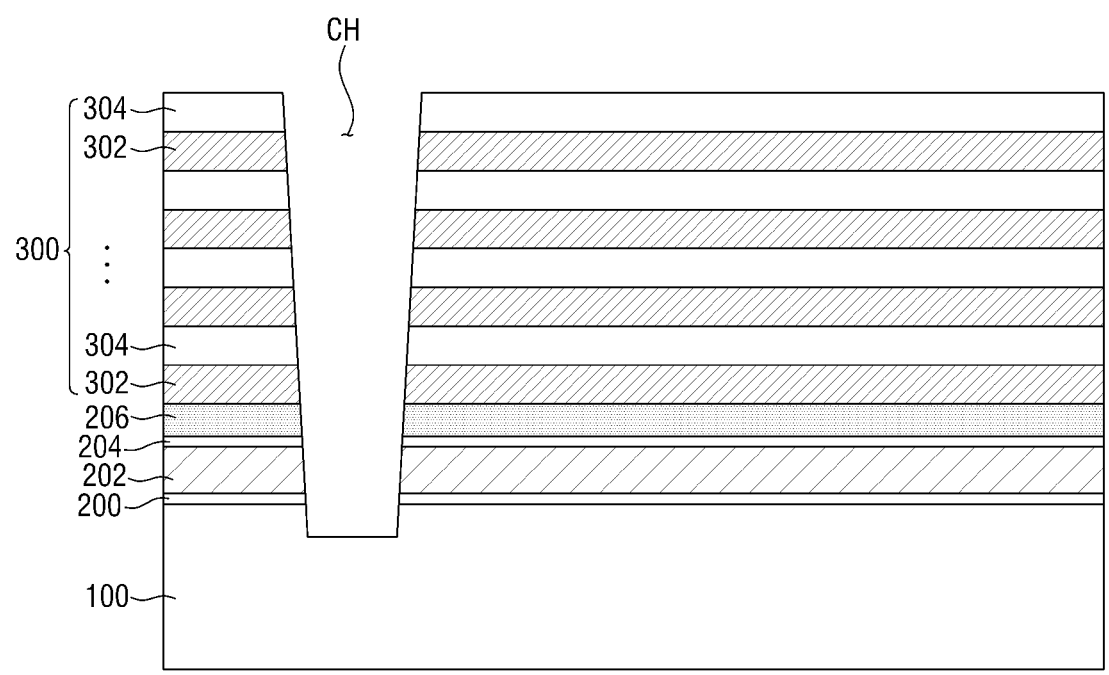

Referring to FIG. 4, a channel hole CH penetrating at least one of the mold structure 300, the etching stop film 206, the first sacrificial insulating layer 200, the sacrificial semiconductor layer 202, the second sacrificial insulating layer 204, and the substrate 100 is formed. The shape of the channel hole CH is not limited to only the shape shown in FIG. 4.

Figure 5:
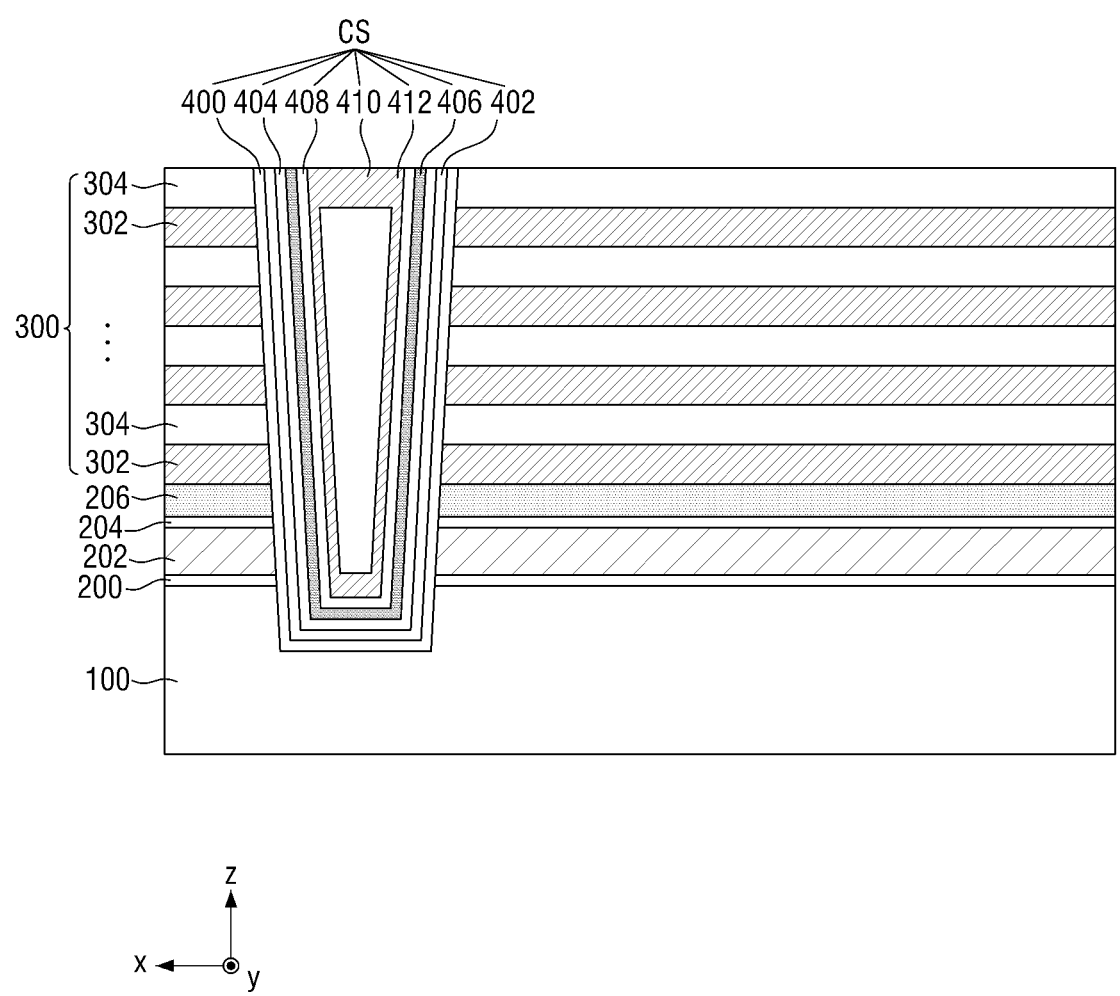

Referring to FIGS. 4 and 5, an anti-oxidation film 400, a first blocking insulation film 402, a second blocking insulation film 404, a charge storage film 406, a tunnel insulating film 408 and a channel semiconductor 412 may be sequentially formed along a side wall of the channel hole CH to form a channel structure CS.

That is, an anti-oxidation film 400 may be formed on the outermost side of the channel hole CH. The anti-oxidant film 400 may include aluminum nitride (e.g., AlN). The anti-oxidant film 400 may prevent oxidation that may occur between the second semiconductor layer 302 and the first blocking insulation film 402.

A first blocking insulation film 402 may be formed along the anti-oxidation film 400. The first blocking insulation film 402 may include aluminum oxide (e.g., AlO). The first blocking insulation film 402 may prevent a phenomenon in which the charge storage film 406 and the charges are tunneled with each other.

A second blocking insulation film 404 may be formed along the first blocking insulation film 402. The second blocking insulation film 404 may be formed of silicon oxide ($SiO_2$), silicon nitride ($Si_3N_4$), silicon oxynitride (SiON) or a high dielectric constant (high-k) material or a composite layer stacked by a combination thereof. The high dielectric constant (high-k) material may include, but is not limited to, at least one of aluminum oxide ($Al_2O_3$), yttrium oxide ($Y_2O_3$), and zirconium oxide ($ZrO_2$).

A charge storage film 406 may be formed along the second blocking insulation film 404. The charge storage film 406 may include, for example, at least one of silicon oxide, silicon nitride, silicon oxynitride, and a high dielectric constant material having a higher dielectric constant than silicon oxide. Examples of the high dielectric constant material may include, but are not limited to, at least one of aluminum oxide, hafnium oxide, lanthanum oxide, tantalum oxide, titanium oxide, lanthanum hafnium oxide, lanthanum aluminum oxide, dysprosium scandium oxide, and combinations thereof.

A tunnel insulating film 408 may be formed along the charge storage film 406. The tunnel insulating film 408 may include, for example, but is not limited to, silicon oxide or a high dielectric constant material having a higher dielectric constant than silicon oxide (e.g., aluminum oxide ($Al_2O_3$), and hafnium oxide ($HfO_2$)).

A channel semiconductor 412 may be formed along the tunnel insulating film 408. The channel semiconductor 412 may include, but is not limited to, semiconductor materials such as single crystal silicon, polycrystalline silicon, organic semiconductor material and carbon nanostructure.

The channel structure CS may further include a channel pad 410 on the top. An internal space may be formed in the channel structure CS due to the channel pad 410 and the channel semiconductor 412, and the internal space may include a filling pattern. The filling pattern may include, but is not limited to, silicon oxide.

Figure 6:
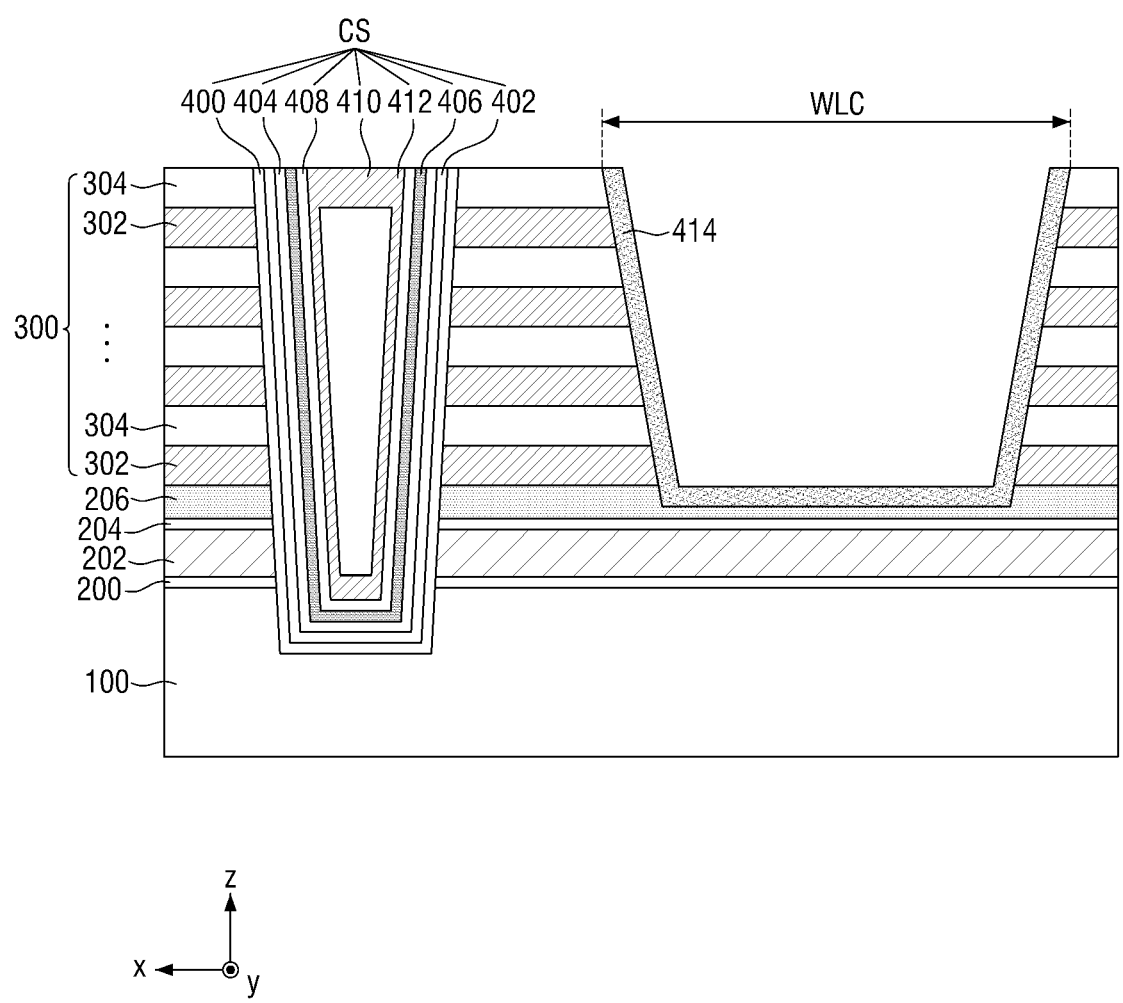

Referring to FIG. 6, a word line cut region WLC is formed to penetrate the mold structure 300. The formation of the word line cut WLC stops at (or in) the etching stop film 206. When forming the word line cut region WLC, the etching stop film 206 including a metal oxide (e.g., $HfO_2$) may serve as an etching stop to prevent the word line cut region WLC from extending to the second sacrificial insulating layer 204.

An insulating pattern 414 may be formed along the side wall of the word line cut region WLC. The insulating pattern 414 may include an insulating material. For example, the insulating pattern 414 may be formed of silicon nitride (SiN).

Figure 7:
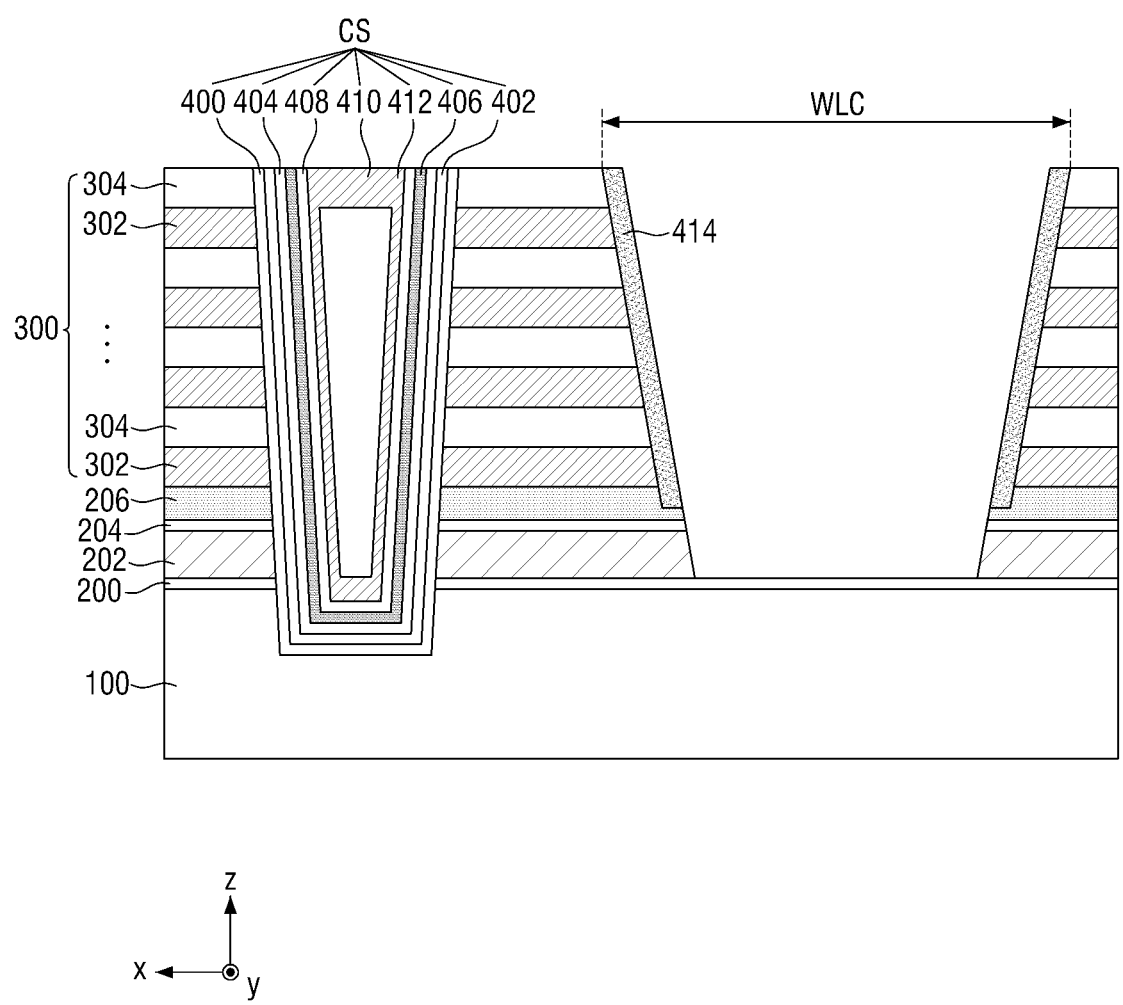

Referring to FIG. 7, the lower part of the word line cut region WLC is further etched. Therefore, the word line cut region WLC may penetrate the mold structure 300, the etching stop film 206, the second sacrificial insulating layer 204, and the sacrificial semiconductor layer 202. That is, the lower part of the word line cut region WLC may expose part of the first sacrificial insulating layer 200.

Figure 8:
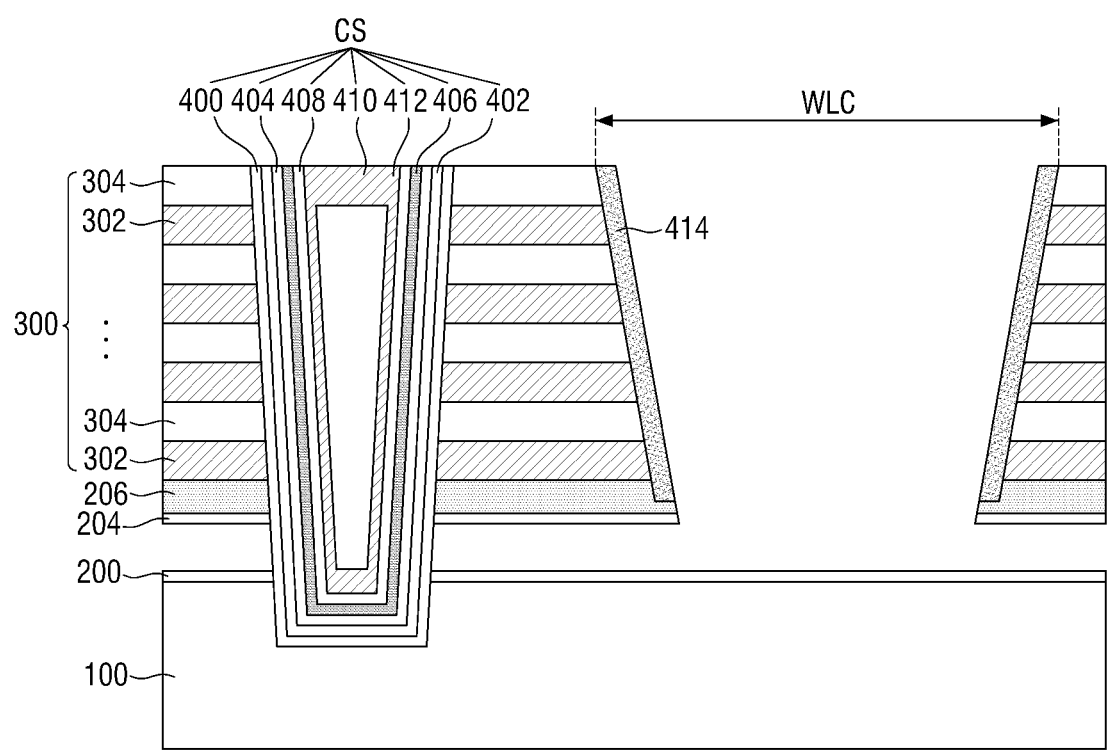

Referring to FIG. 8, the sacrificial semiconductor layer 202 of FIG. 7 is removed. At this time, the sacrificial semiconductor layer 202 of FIG. 7 may be removed using a full back process, by the use of a space exposed through the word line cut region WLC. When removing the sacrificial semiconductor layer 202 of FIG. 7, the insulating pattern 414 may prevent the removal of the second semiconductor layer 302.

Figure 9:
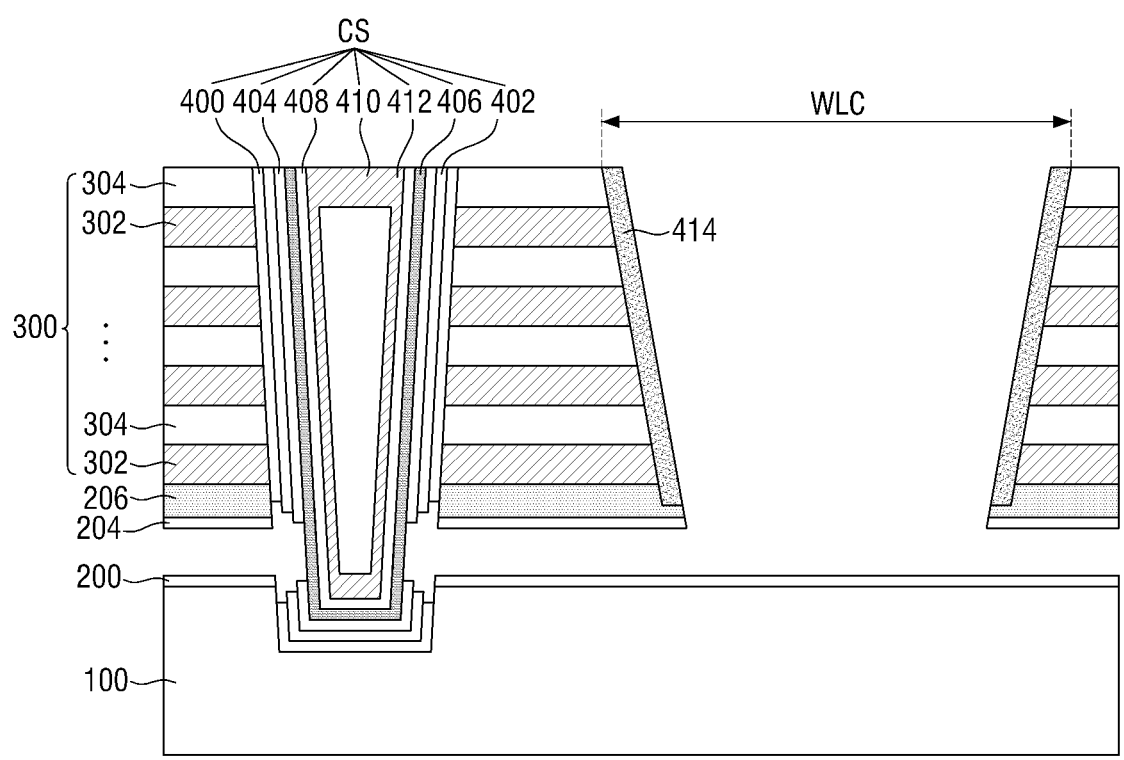

Referring to FIG. 9, part of the anti-oxidation film 400, part of the first blocking insulation film 402 and part of the second blocking insulation film 404 are sequentially etched through a region exposed by the removal of the sacrificial semiconductor layer 202 of FIG. 7.

When removing the anti-oxidant film 400 and the first blocking insulation film 402, strong phosphoric acid (HP) may be used. When removing the second blocking insulation film 404, hydrogen fluoride (HF) may be used. Due to the above-described etching processes, part of the charge storage film 406 may be exposed through a region exposed by the removal of the sacrificial semiconductor layer 202 of FIG. 7.

Figure 10:
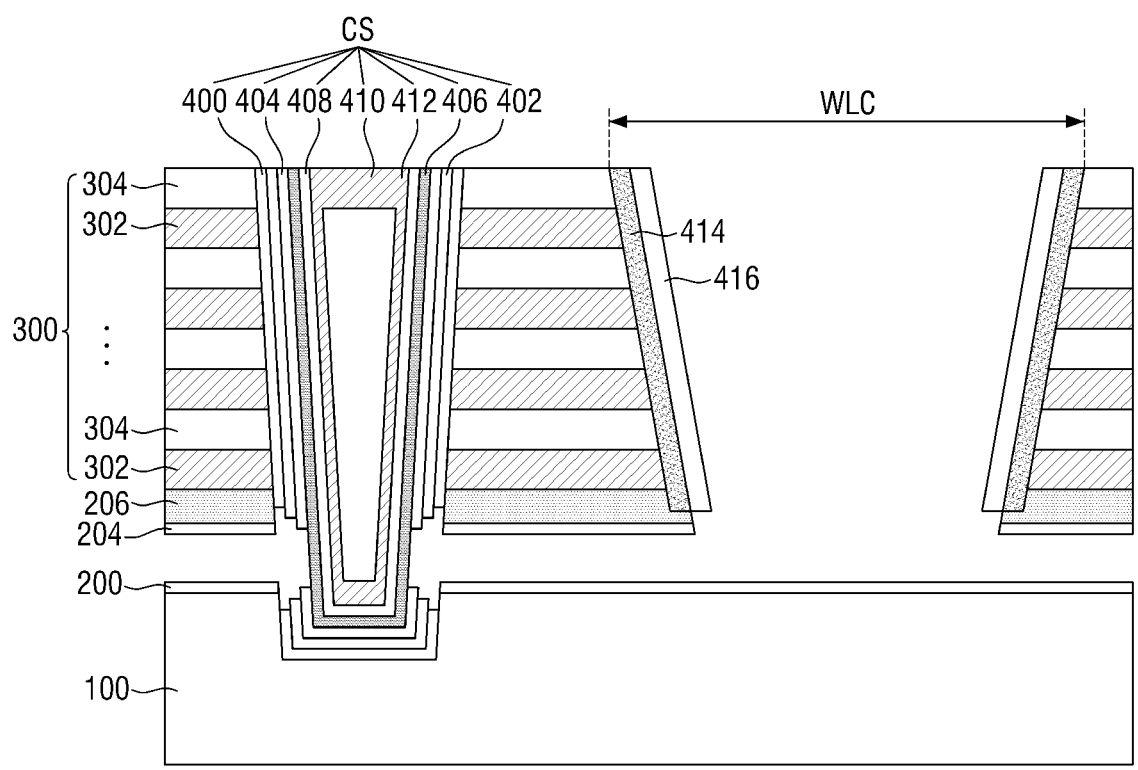

Referring to FIG. 10, the insulating pattern 414 is oxidized to form a sacrificial insulating spacer 416. The sacrificial insulating spacer 416 may be, but is not limited to, a silicon nitride oxide (SiON) film.

Figure 11:
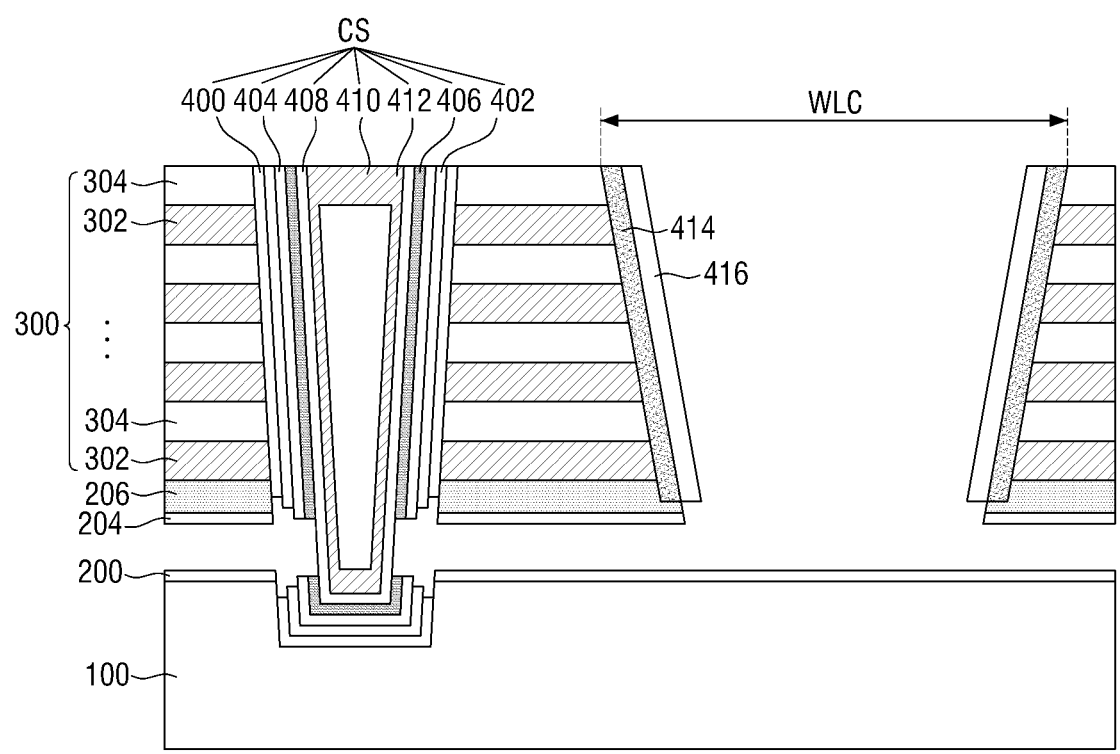

Referring to FIG. 11, the charge storage film 406 is removed through the region exposed by the removal of the sacrificial semiconductor layer 202 of FIG. 7, and the region exposed by sequentially etching part of the anti-oxidant film 400, part of the first blocking insulation film 402, and part of the second blocking insulation film 404.

Upon removal of the charge storage film 406, strong phosphoric acid (HP) may be used. At this time, since the metal oxide (e.g., hafnium oxide ($HfO_2$)) that forms the etching stop film 206 has a selective ratio to strong phosphoric acid (HP) lower than a material (e.g., silicon nitride (SiN)) that forms the charge storage film 406, the etching stop film 206 may not be removed.

Figure 12:
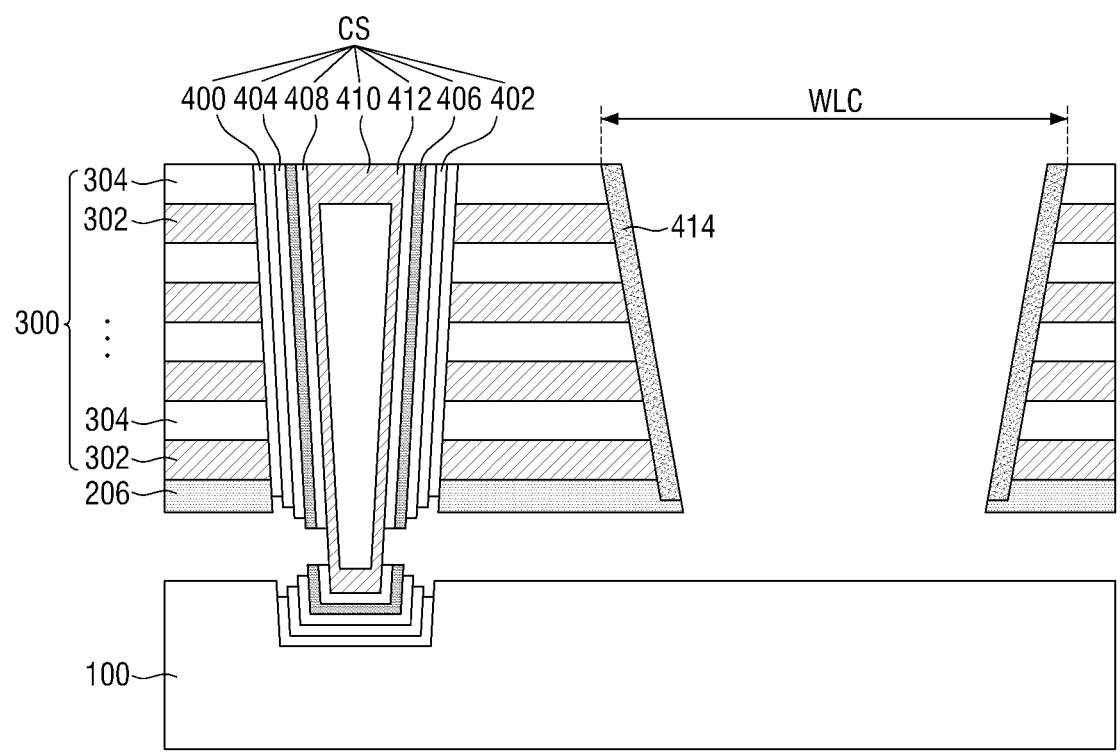

Referring to FIG. 12, the tunnel insulating film 408 and the sacrificial insulating spacer 416 of FIG. 11 are removed.

Figure 13:
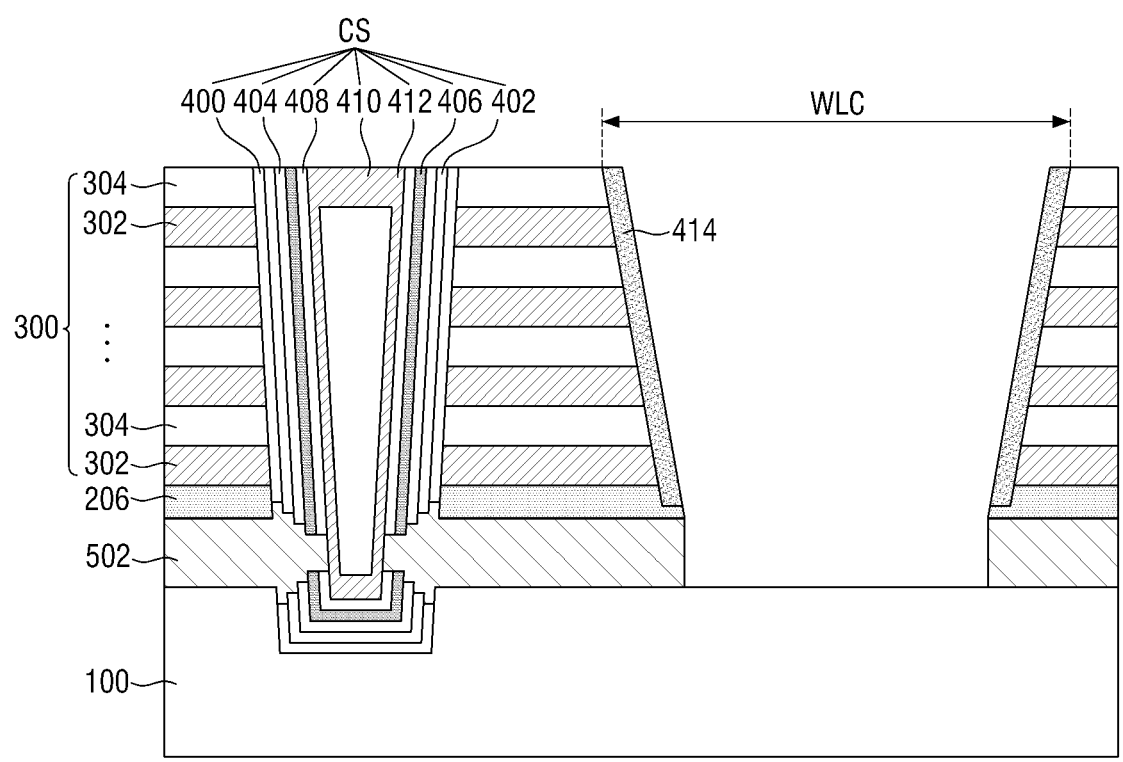

Referring to FIG. 13, a first semiconductor layer 502 is formed in part of a region exposed by the removal of the sacrificial semiconductor layer 202 of FIG. 7, and in a region exposed by the removal of part of the anti-oxidant film 400, part of the first blocking insulation film 402, part of the second blocking insulation film 404, part of the charge storage film 406, and part of the tunnel insulating film 408. The first semiconductor layer 502 may be N-type doped polysilicon.

Figure 14:
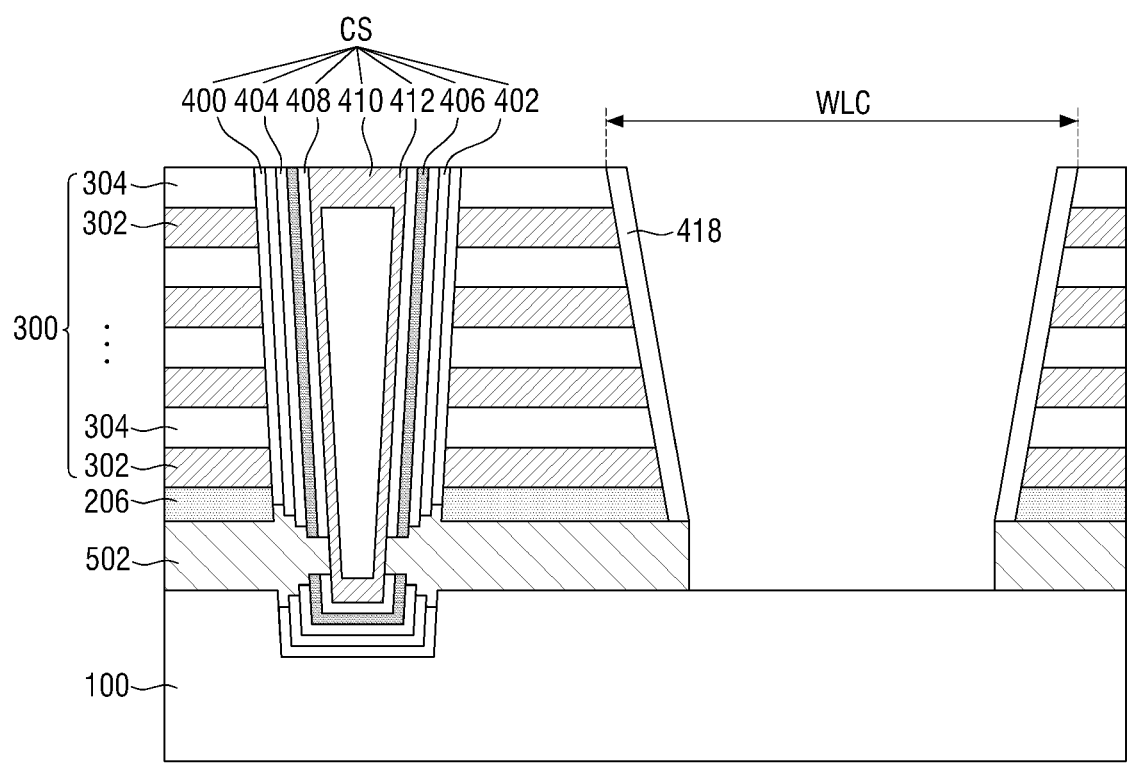

Referring to FIG. 14, an insulating spacer 418 is formed. The insulating spacer 418 may be a silicon nitride oxide (SiON) film formed by oxidizing the insulating pattern 414 of FIG. 13. Although it is not shown, the insulating spacer 418 may be made of a plurality of spacer layers including a silicon nitride (SiN) film and a silicon nitride oxide (SiON) film. However, the insulating spacer 418 of the nonvolatile memory device is not limited thereto.

Figure 15:
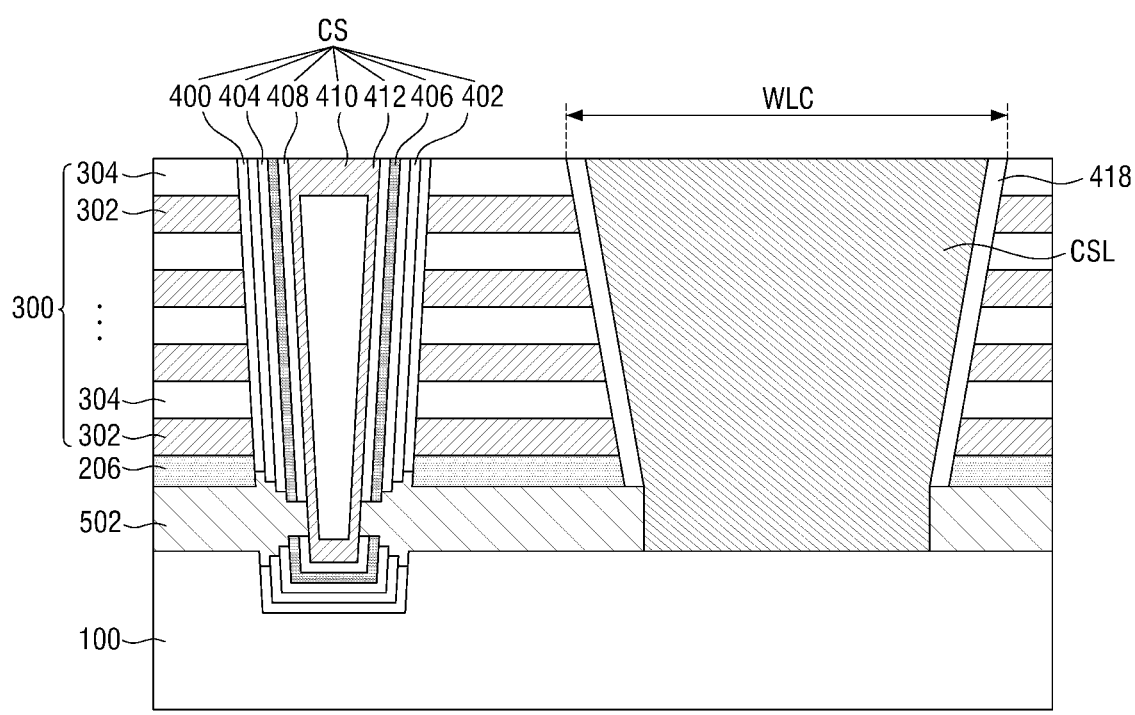

Referring to FIG. 15, a common source line CSL is formed. The common source line CSL may be formed by filling a conductive material inside the word line cut region WLC and in the region on the substrate 100 exposed through the first semiconductor layer 502. The conductive material may include, but is not limited to, metals such as tungsten (W), cobalt (Co), nickel (Ni), and semiconductor materials such as silicon.

In this manner, the nonvolatile memory device of FIG. 2 may be fabricated by forming a bit line contact, an interlayer insulating film, and a bit line.

Figure 16:
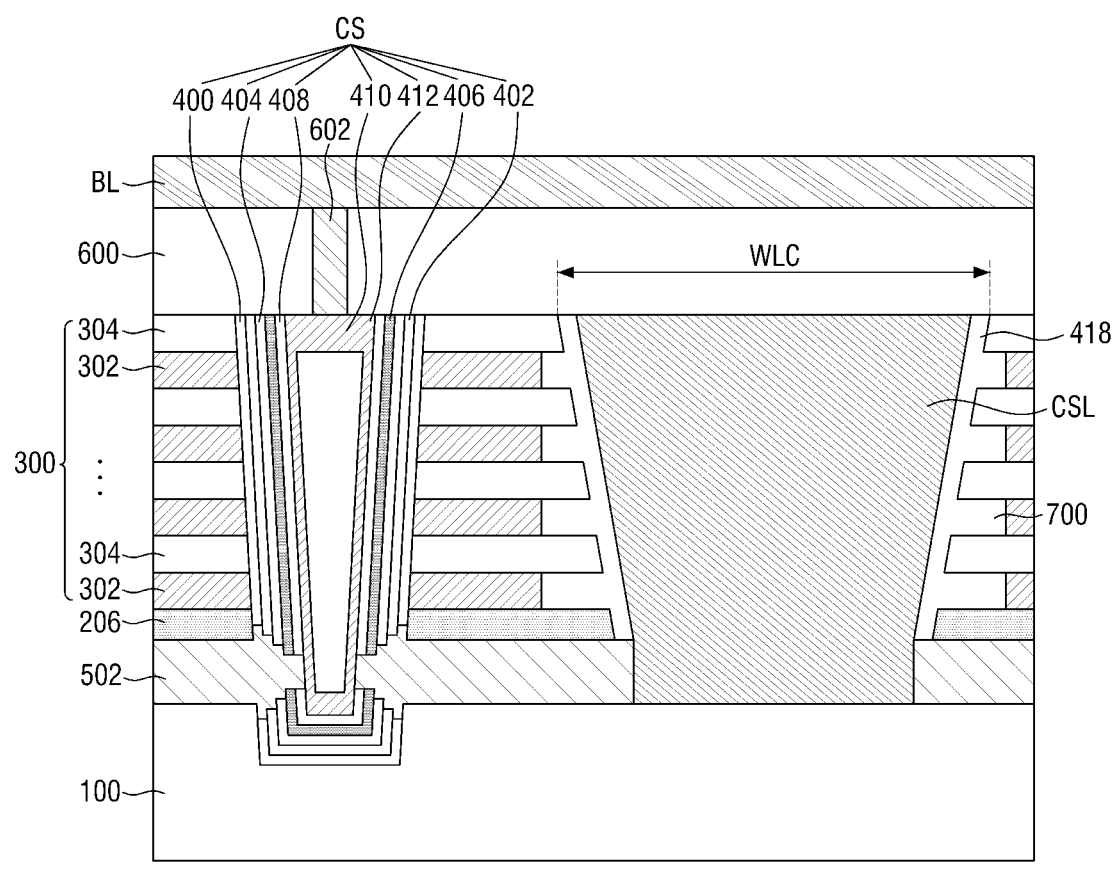
FIGS. 16 and 17 are cross-sectional diagrams illustrating examples of nonvolatile memory devices according to embodiments of the inventive concept.

FIG. 16 is a cross-sectional diagram illustrating another nonvolatile memory device according to embodiments of the inventive concept.

Referring to FIG. 16 and comparing the embodiment described in relation to FIG. 2, the insulating spacer 418 may further include a protrusion 700.

Here, the protrusion 700 may be formed by allowing the insulating spacer 418 to penetrate into the second semiconductor layer 302 during the process of FIG. 14 using (e.g.,) a sufficient oxidation course.

Since the insulating spacer 418 further includes the protrusion 700 that penetrates into the second semiconductor layer 302, it is possible to further improve the electrical insulation performance between each second semiconductor layer 302 and the common source line CSL.

Figure 17:
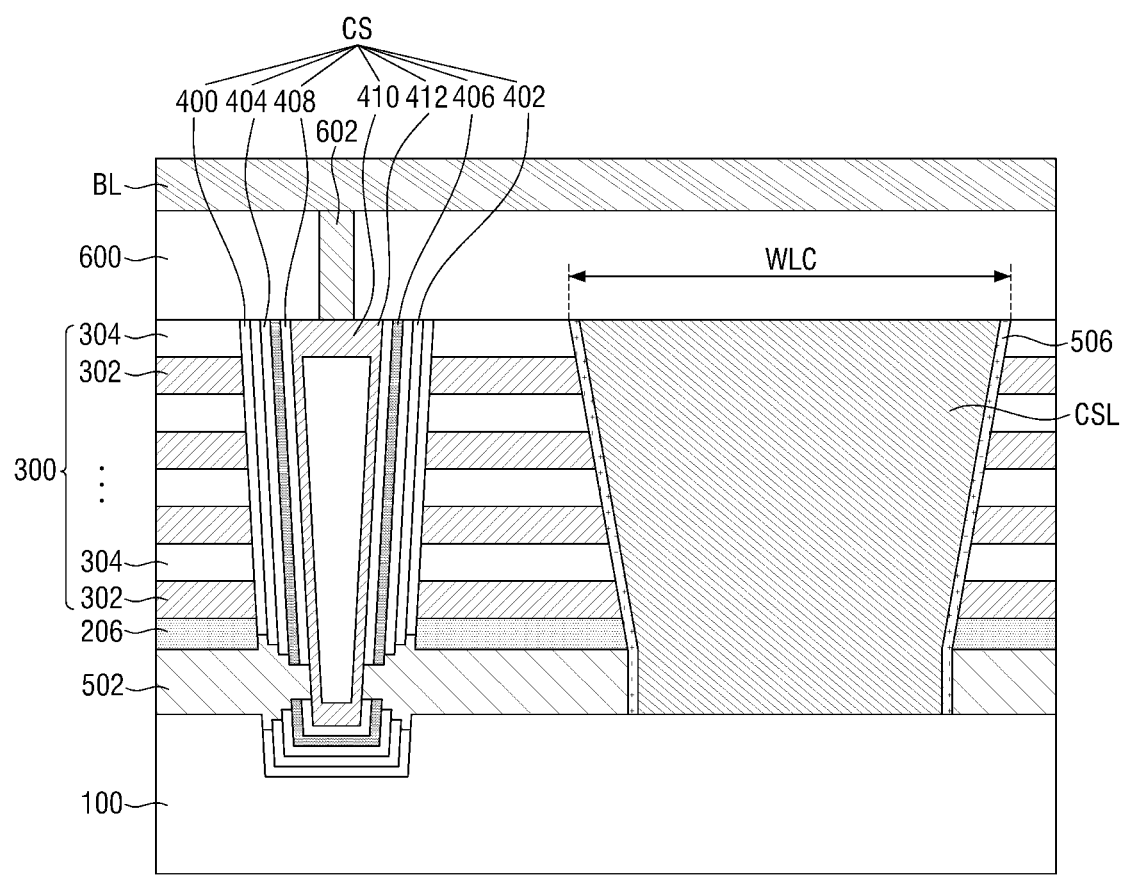

FIG. 17 is a cross-sectional diagram illustrating still another nonvolatile memory device according to embodiments of the inventive concept.

Referring to FIG. 17 and comparing the embodiment described in relation to FIG. 2, the insulating spacer 506 may descend along the side walls of the charge storage film 406 and the first semiconductor layer 502 to contact the substrate 100. Also, the insulating spacer 506 of the nonvolatile memory device of FIG. 17 may include material(s) different from the insulating spacer 418 of the nonvolatile memory device of FIG. 2.

The insulating spacer 506 may include a silicon oxide obtained by oxidizing polysilicon. (See, e.g., FIG. 25). Although not shown in FIG. 17, the insulating spacer 506 may be made up of a plurality of spacer layers including a polysilicon film and a silicon oxide film. However, the insulating spacer 506 is not limited thereto.

FIGS. 18 to 27 are related, cross-sectional diagrams illustrating a method of fabricating the nonvolatile memory device of FIG. 17 according to embodiments of the inventive concept.

Figure 18:
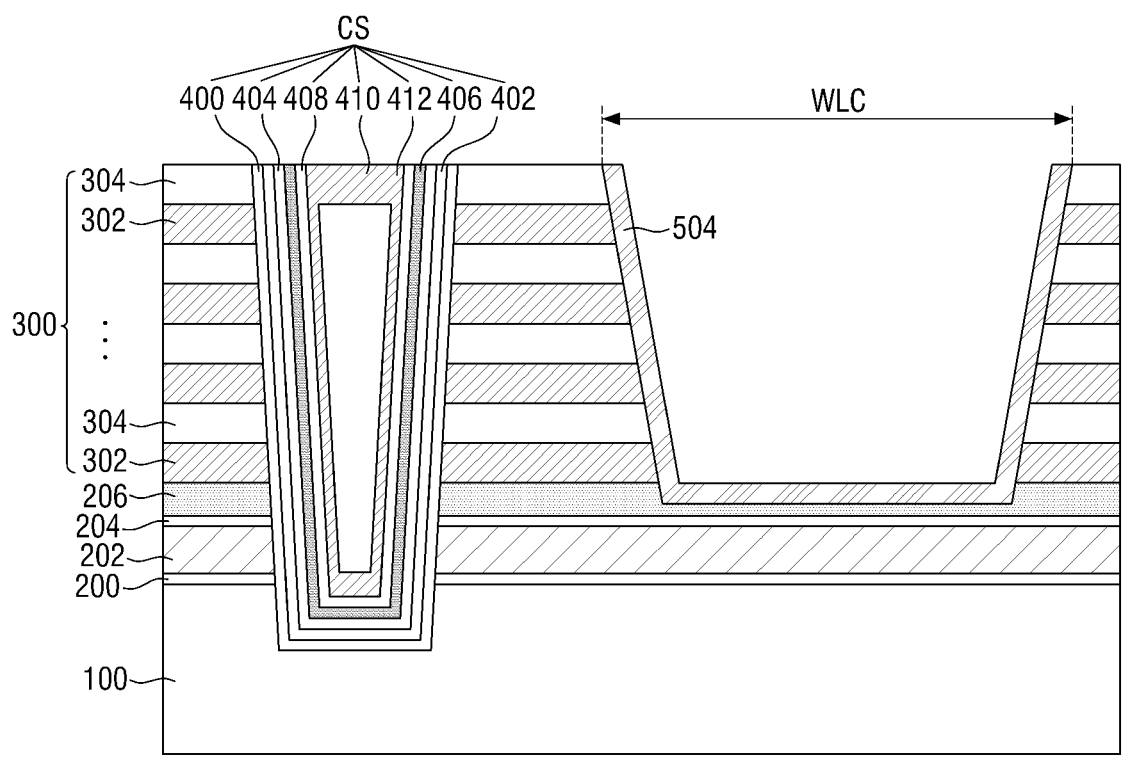
FIGS. 18, 19, 20, 21, 22, 23, 24, 25, 26 and 27 (hereafter collectively, "FIGS. 18 to 27") are related, cross-sectional diagrams illustrating another one example of a method of fabricating the nonvolatile memory device of FIG. 17 according to embodiments of the inventive concept.

Referring to FIG. 18 and comparing the embodiment described in relation to FIG. 6, a spacer semiconductor pattern 504 is formed along the side wall of the word line cut region WLC. The spacer semiconductor pattern 504 may be P-type doped polysilicon.

Figure 19:
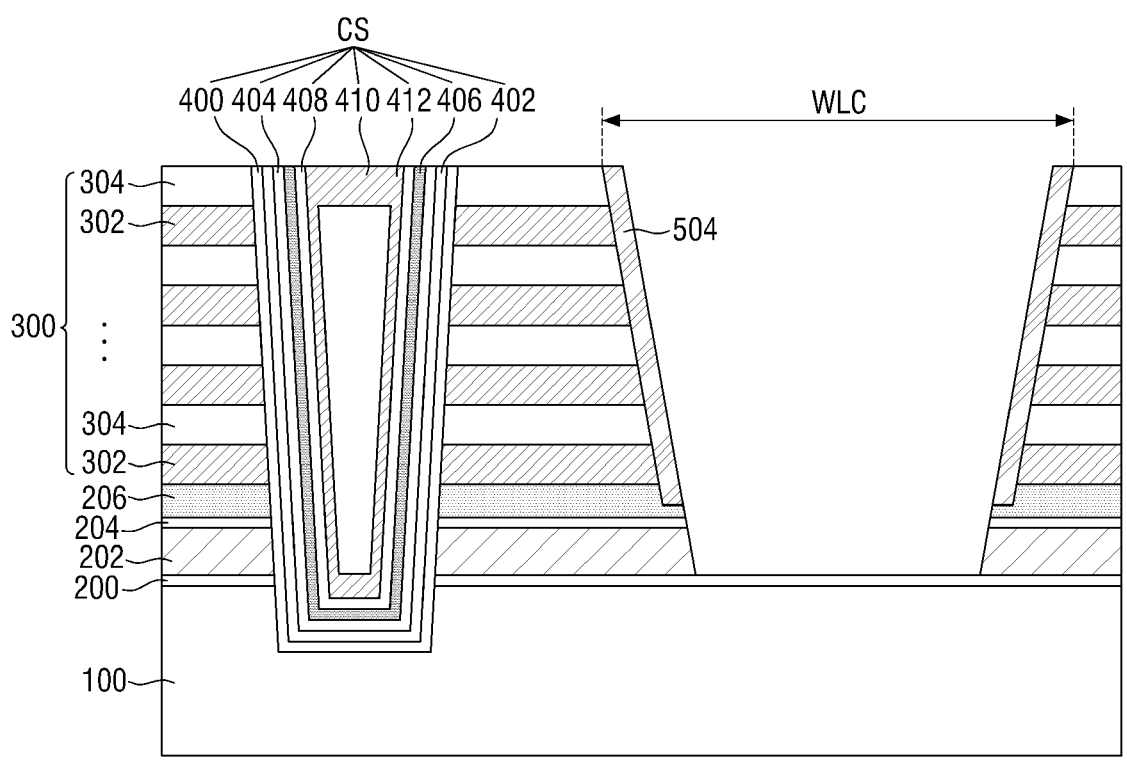

Referring to FIG. 19, the lower part of the word line cut region WLC is further etched. Therefore, the word line cut region WLC may penetrate the mold structure 300, the etching stop film 206, the second sacrificial insulating layer 204, and the sacrificial semiconductor layer 202. That is, the lower part of the word line cut region WLC may expose part of the first sacrificial insulating layer 200.

Figure 20:
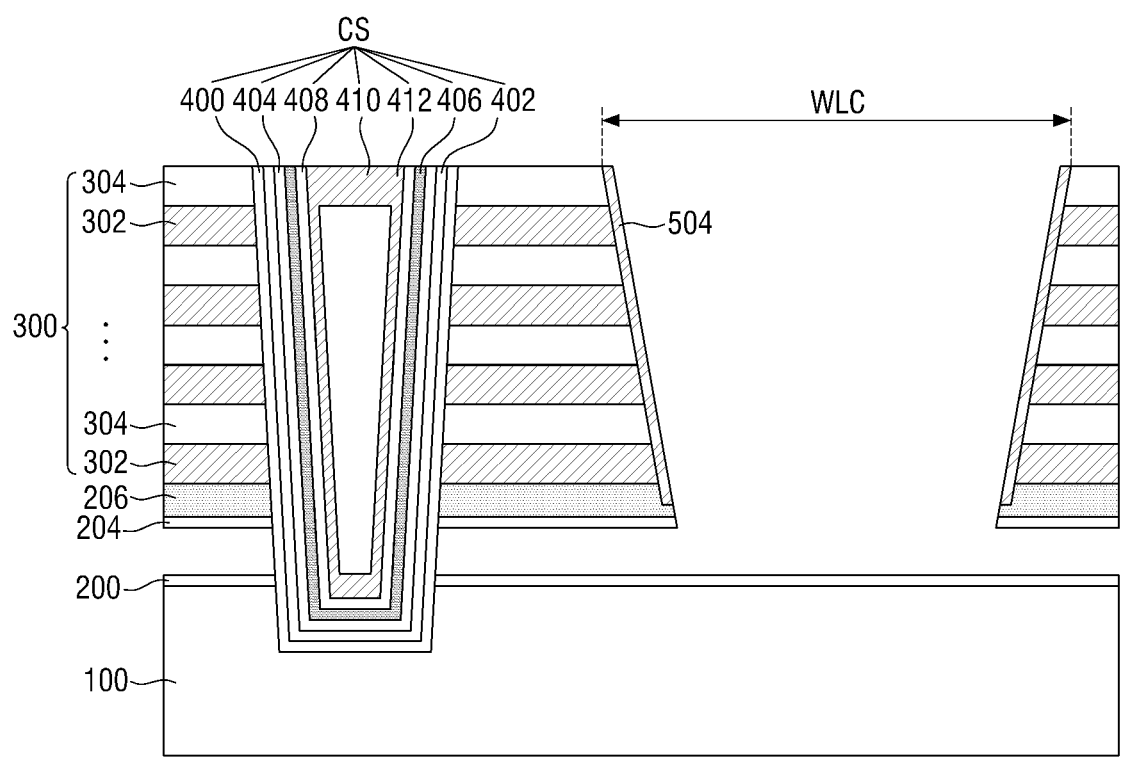

Referring to FIG. 20, the sacrificial semiconductor layer 202 of FIG. 19 is removed. At this time, the sacrificial semiconductor layers 202 of FIG. 19 may be removed by the use of the full back process, using the space exposed through the word line cut region WLC. When the sacrificial semiconductor layer 202 of FIG. 19 is removed, part of the spacer semiconductor pattern 504 may also be removed. Therefore, the spacer semiconductor pattern 504 may be made thinner than the thickness in FIG. 19.

Figure 21:
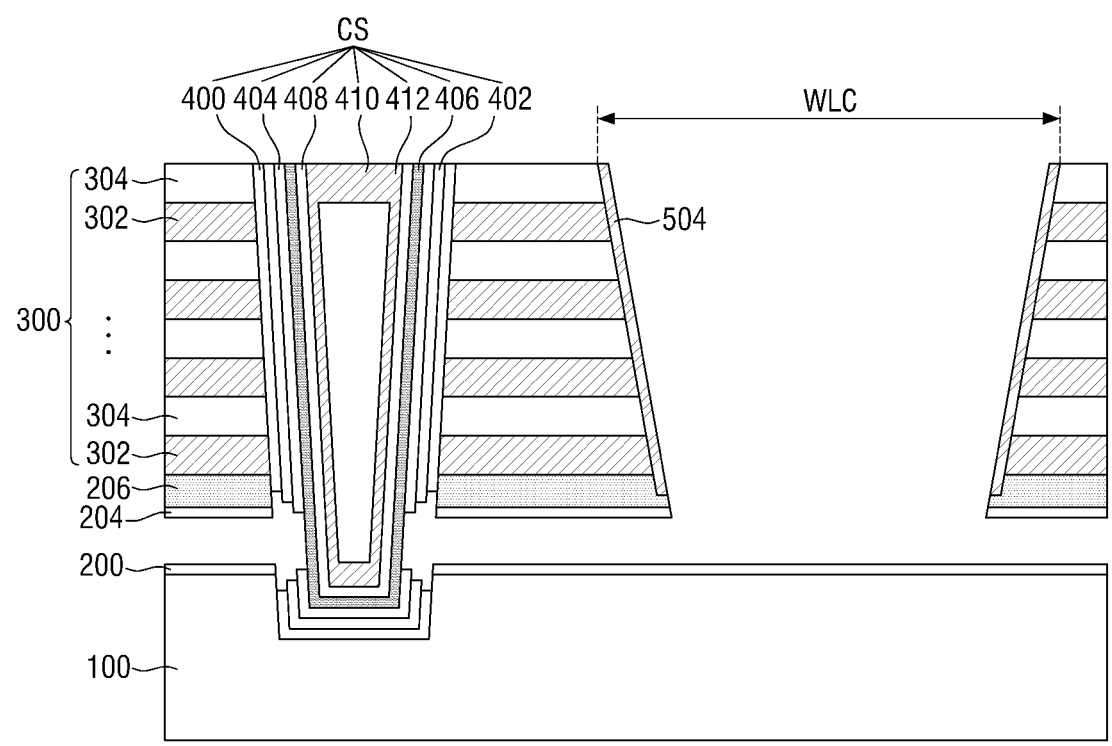

Referring to FIG. 21, part of the anti-oxidation film 400, part of the first blocking insulation film 402 and part of the second blocking insulation film 404 are sequentially etched through a region exposed by the removal of the sacrificial semiconductor layer 202 of FIG. 19. When removing the anti-oxidant film 400 and the first blocking insulation film 402, strong phosphoric acid (HP) may be used. When removing the second blocking insulation film 404, hydrogen fluoride (HF) may be used. Due to the above-described etching processes, part of the charge storage film 406 may be exposed through a region exposed by the removal of the sacrificial semiconductor layer 202 of FIG. 19.

Figure 22:
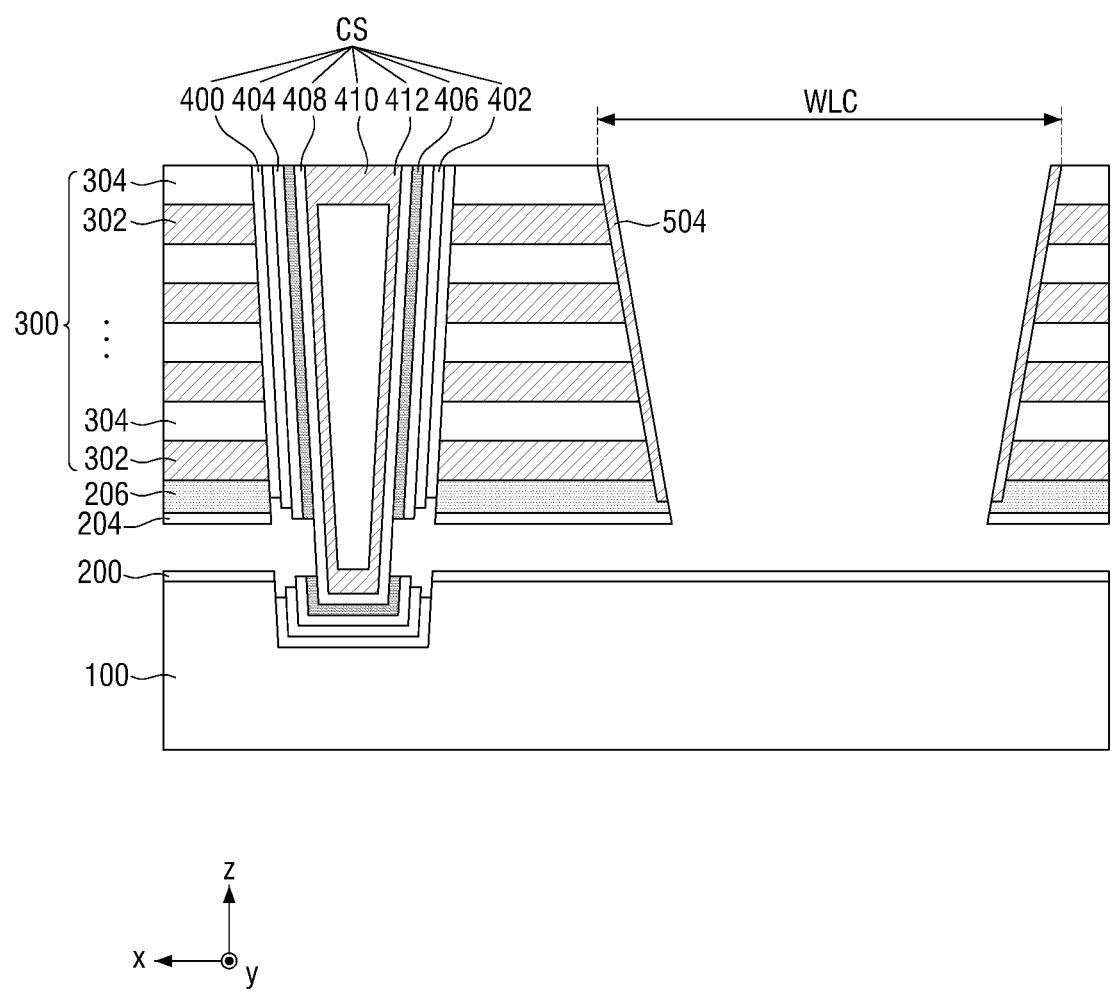
Figure 23:
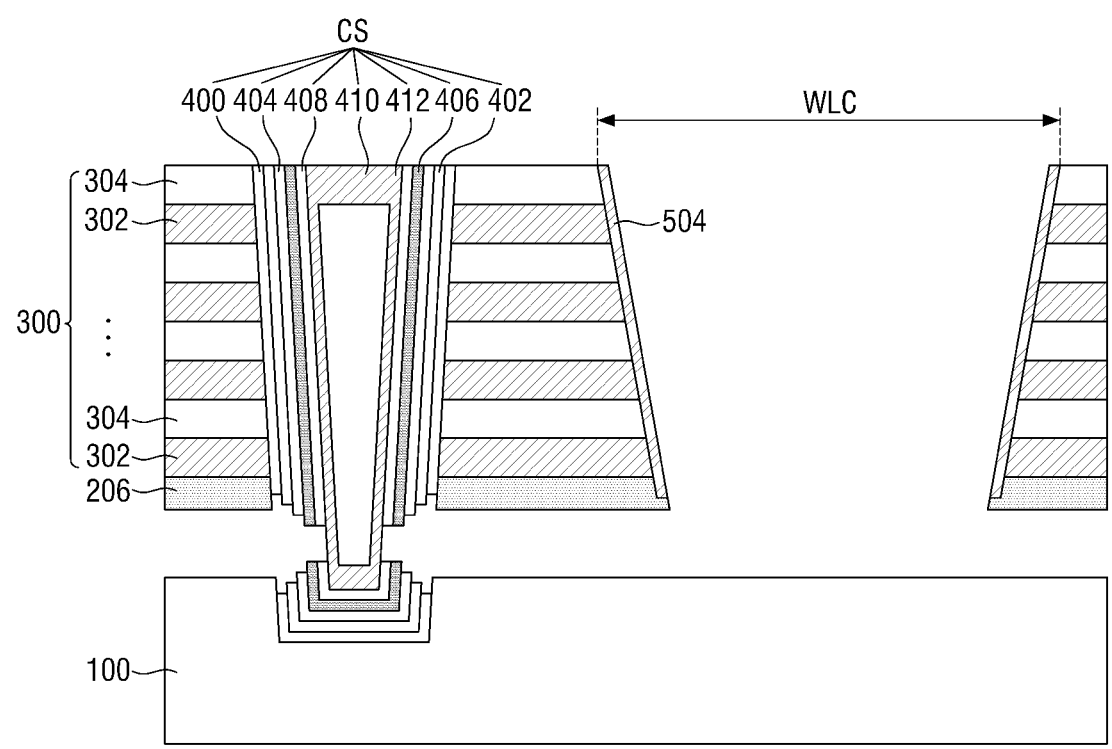

Referring to FIG. 22, the charge storage film 406 is removed through a region exposed by the removal of the sacrificial semiconductor layer 202 of FIG. 7, and a region exposed by sequentially etching part of the anti-oxidant film 400, part of the first blocking insulation film 402, and part of the second blocking insulation film 404.

Upon removal of the charge storage film 406, strong phosphoric acid (HP) may be used. At this time, since the metal oxide (e.g., hafnium oxide ($HfO_2$)) that forms the etching stop film 206 has a selective ratio to strong phosphoric acid (HP) lower than that of a material (e.g., silicon nitride (SiN)) that forms the charge storage film 406, the etching stop film 206 may not be removed.

In the method of fabricating the nonvolatile memory device of FIG. 22, since the material for forming the spacer semiconductor pattern 504 is different from the material for forming the charge storage film 406, as shown in FIG. 11, the fabrication process(es) used to form a protective film (e.g., the sacrificial insulating spacer 416 of FIG. 11) serving to prevent the etching of the spacer semiconductor pattern 504 may be omitted.

That is, by forming the spacer semiconductor pattern 504 on the side wall of the word line cut region WLC in the fabrication process of the nonvolatile memory device of FIG. 18, the overall fabrication process for the nonvolatile memory device according to embodiments of the inventive concept may be simplified.

Figure 24:
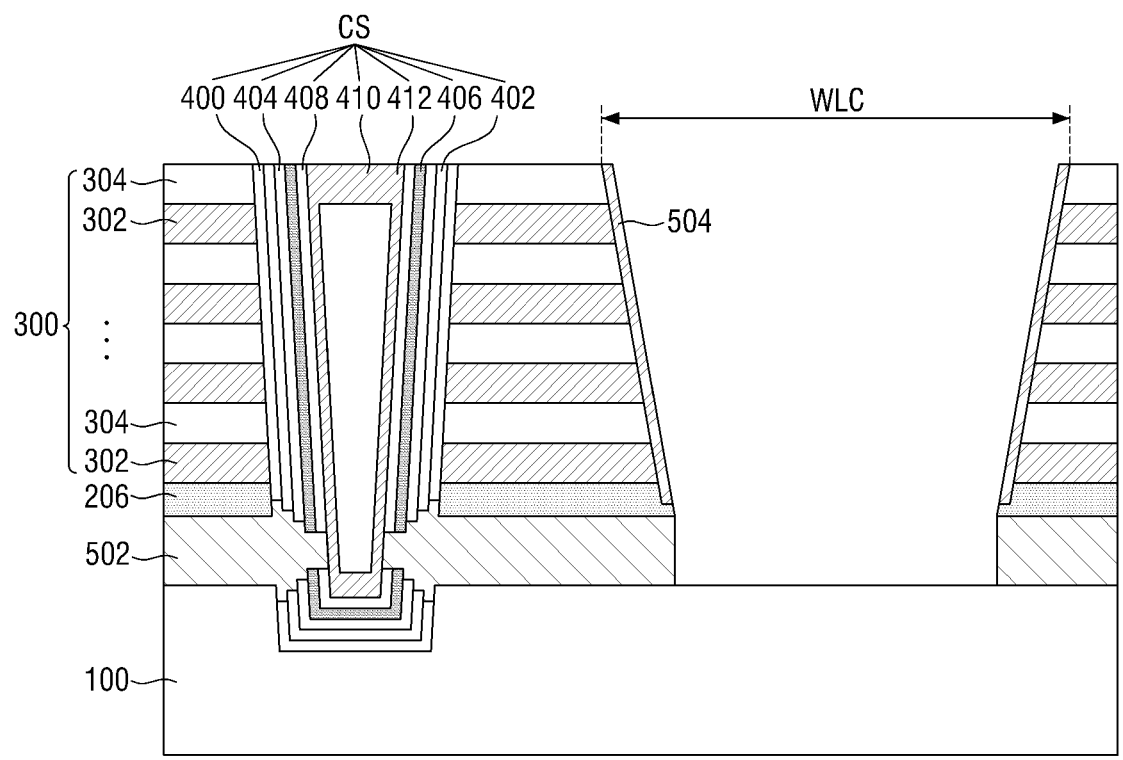

Referring to FIG. 24, a first semiconductor layer 502 is formed in part of a region exposed by the removal of the sacrificial semiconductor layer 202 of FIG. 19, and in a region exposed by the removal of part of the anti-oxidant film 400, part of the first blocking insulation film 402, part of the second blocking insulation film 404, part of the charge storage film 406, and part of the tunnel insulating film 408. The first semiconductor layer 502 may be N-type doped polysilicon.

Figure 25:
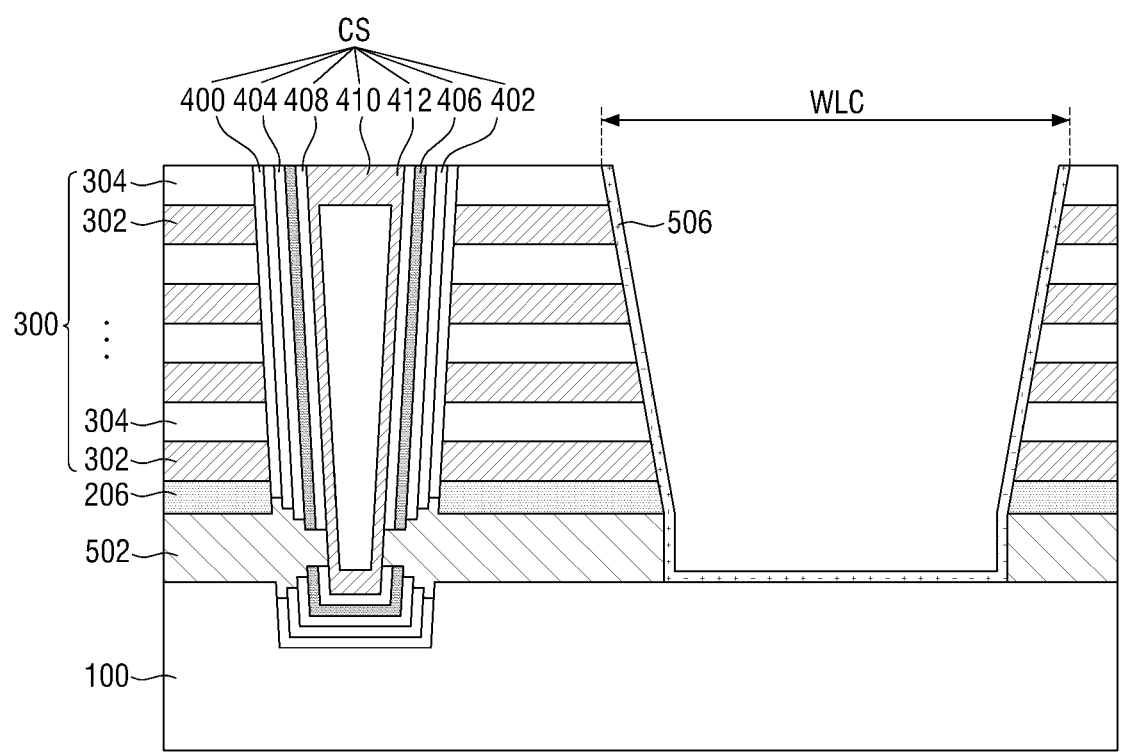

Referring to FIG. 25, an insulating spacer 506 is formed. The insulating spacer 506 may be a silicon oxide film formed by oxidizing the spacer semiconductor pattern 504 of FIG. 24. Although it is not shown, the insulating spacer 506 may be made of a plurality of spacer layers including a polysilicon film and a silicon oxide film. However, the insulating spacer 506 is not limited thereto.

Here, the insulating spacer 506 may be formed by oxidizing the first semiconductor layer 502 and the substrate 100 together. That is, the insulating spacer 506 may be formed along the inner side wall of the word line cut region WLC and the substrate 100.

Figure 26:
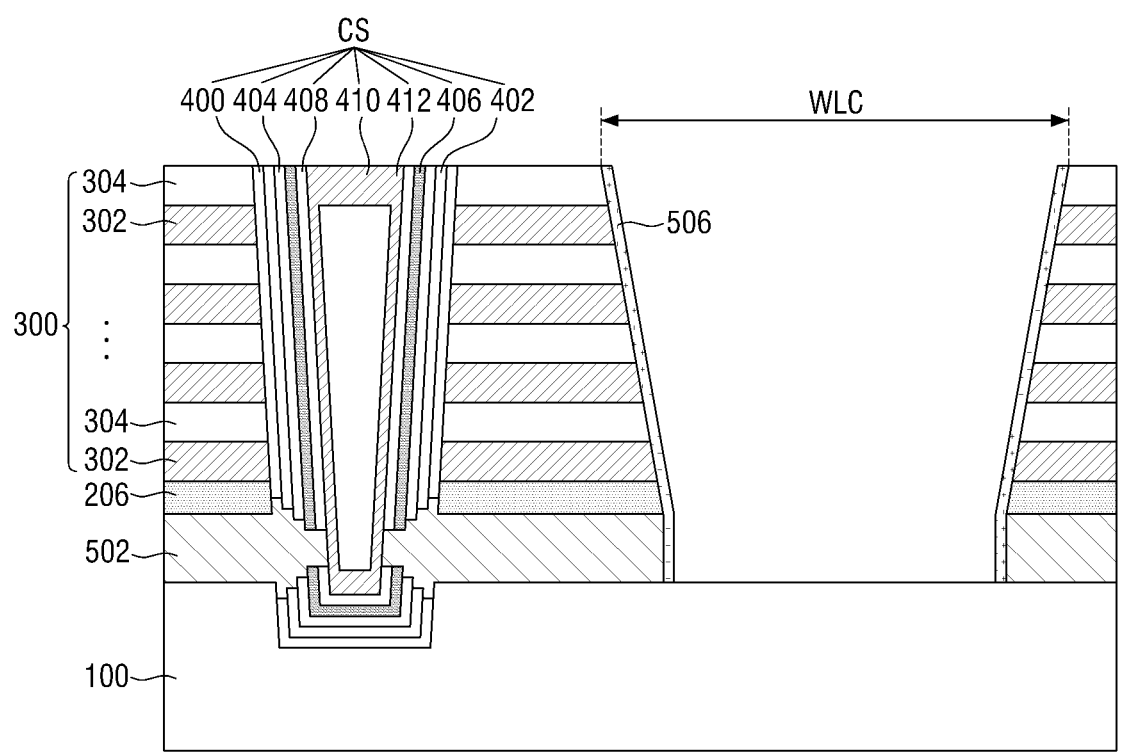

Referring to FIG. 26, the insulating spacer 506 formed on the substrate 100 may be removed, and the substrate 100 may be exposed by removing the insulating spacer 506.

Figure 27:
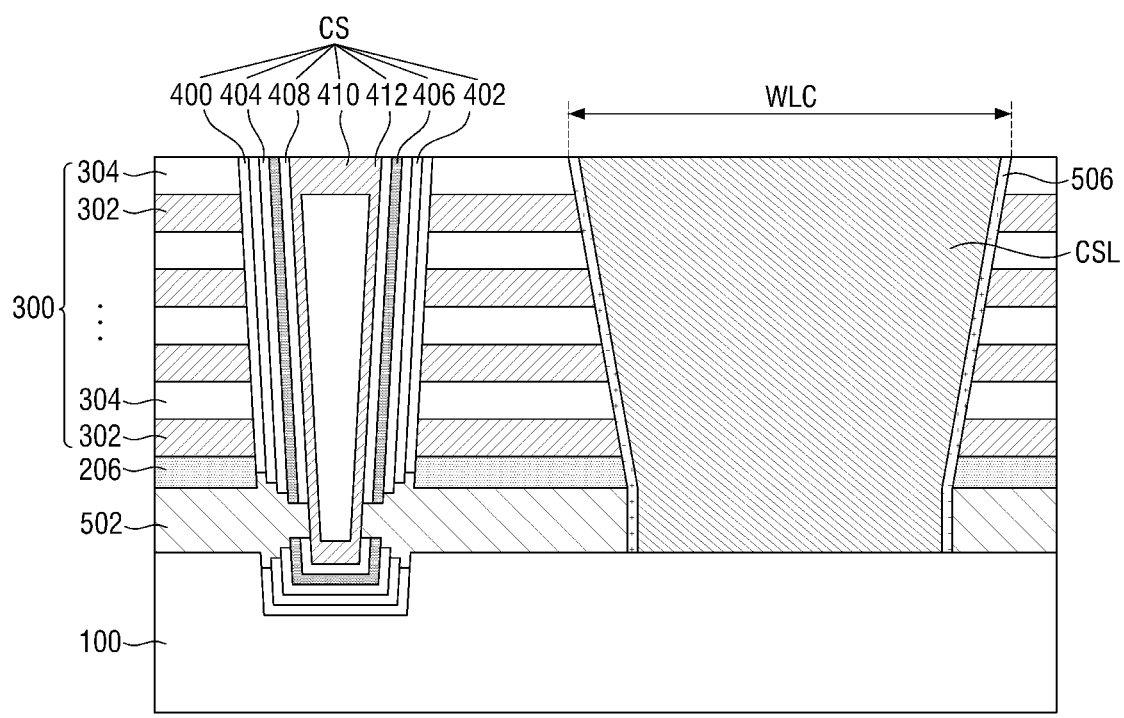

Referring to FIG. 27, a common source line CSL is formed. The common source line CSL may be formed by filling a conductive material inside the word line cut region WLC and in a region on the substrate 100 exposed through the first semiconductor layer 502. The conductive material may include, but is not limited to, metals such as tungsten (W), cobalt (Co) and nickel (Ni) or semiconductor materials such as silicon.

Thereafter, by forming a bit line contact, an interlayer insulating film, and a bit line, the fabrication of the nonvolatile memory device shown in FIG. 17 may be completed.

Figure 28:
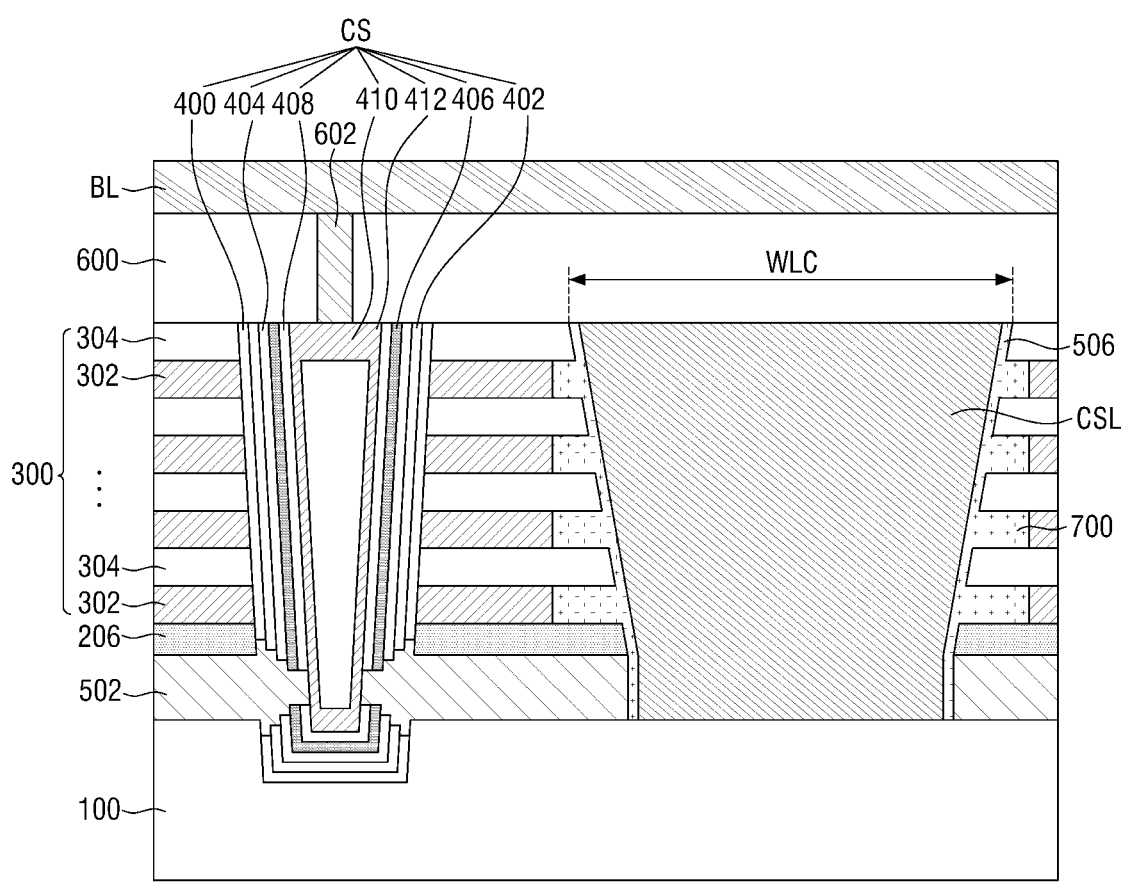
FIG. 28 is a cross-sectional diagram illustrating another example of a nonvolatile memory device according to embodiments of the inventive concept.

FIG. 28 is a cross-sectional diagram illustrating another nonvolatile memory device according to embodiments of the inventive concept.

Referring to FIG. 28 and comparing the embodiment described in relation to FIG. 17, the insulating spacer 506 may further include a protrusion 700.

The protrusion 700 may be formed by allowing the insulating spacer 506 to penetrate into the second semiconductor layer 302 through a sufficient oxidation process during the process of FIG. 27.

Since the insulating spacer 506 further includes the protrusion 700 that penetrates into the second semiconductor layer 302, it is possible to further improve the electrical insulation performance between each second semiconductor layer 302 and the common source line CSL.

Those skilled in the art will appreciate that many variations and modifications may be made to the illustrated embodiments without substantially departing from the principles and scope of the inventive concept.

What is claimed is:
1. A nonvolatile memory device comprising:
a substrate;
a first semiconductor layer on the substrate;
an etching stop film including a metal oxide on the first semiconductor layer;
a mold structure including second semiconductor layers and insulating layers alternately stacked on the etching stop film;
a channel hole which penetrates the mold structure, the etching stop film, the first semiconductor layer and the substrate in a first direction; and
a channel structure which extends inside the channel hole and along a side wall of the channel hole, wherein the channel structure includes an anti-oxidant film on the side wall of the channel hole, a first blocking insulation film on the anti-oxidant film, a second blocking insulation film on the first blocking insulation film, a charge storage film on the second blocking insulation film, a tunnel insulating film on the charge storage film and a channel semiconductor on the tunnel insulation film,
wherein the anti-oxidant film is in contact with the second semiconductor layers,
wherein the second semiconductor layers are polysilicon,
wherein the channel semiconductor does not contact the anti-oxidant film,
wherein the first semiconductor layer penetrates the anti-oxidant film in a second direction intersecting the first direction, and directly contacts the first blocking insu- lation film, the second blocking insulation film, the charge storage film, and the tunnel insulating film, and wherein the anti-oxidant film is AlN.

2. The nonvolatile memory device of claim 1, wherein the metal oxide is $HfO_2$.

3. The nonvolatile memory device of claim 1, wherein a thickness of the etching stop film is the same as a thickness of the second semiconductor layers.

4. The nonvolatile memory device of claim 1, further comprising:
a common source line plate between the substrate and the first semiconductor layer,
wherein the channel hole penetrates the mold structure, the etching stop film, the first semiconductor layer, and the common source line plate.

5. The nonvolatile memory device of claim 1, wherein the second semiconductor layers are P-doped polysilicon.

6. The nonvolatile memory device of claim 5, wherein the first semiconductor layer is N-doped polysilicon.

7. A nonvolatile memory device comprising:
a substrate;
a first semiconductor layer on the substrate;
an etching stop film including a metal oxide on the first semiconductor layer;
a mold structure including second semiconductor layers and insulating layers alternately stacked on the etching stop film;
a common source line which penetrates the mold structure, the etching stop film and the first semiconductor layer in a first direction, and includes conductive materials;
an insulating spacer between the mold structure and the common source line, the insulating spacer does not contact the first semiconductor layer;
a channel hole which penetrates the mold structure, the etching stop film, the first semiconductor layer and the substrate in the first direction; and
a channel structure which extends along a side wall of the channel hole, and includes an anti-oxidant film, a first blocking insulation film, a second blocking insulation film, a charge storage film, a tunnel insulating film and a channel semiconductor sequentially disposed on the side wall of the channel hole,
wherein the anti-oxidant film is in contact with the second semiconductor layers, wherein the second semiconductor layers are polysilicon,
wherein the first semiconductor layer penetrates the anti-oxidant film in a second direction intersecting the first direction, and directly contacts the first blocking insulation film, the second blocking insulation film, the charge storage film, and the tunnel insulating film,
wherein the channel semiconductor does not contact the anti-oxidant film,
wherein the common source line is electrically connected to the channel semiconductor through the substrate and the first semiconductor layer, and
wherein the anti-oxidant film is AlN.

8. The nonvolatile memory device of claim 7, wherein the metal oxide is $HfO_2$.

9. The nonvolatile memory device of claim 7, wherein a thickness of the etching stop film is the same as a thickness of the second semiconductor layers.

10. The nonvolatile memory device of claim 7, further comprising:
a common source line plate between the substrate and the first semiconductor layer,
wherein the channel hole penetrates through the mold structure, the etching stop film, the first semiconductor layer, and the common source line plate.

11. The nonvolatile memory device of claim 7, further comprising:
an insulating spacer between the mold structure and the common source line, between the etching stop film and the common source line, and between the first semiconductor layer and the common source line.

12. The nonvolatile memory device of claim 11, wherein the insulating spacer includes at least one insulating material.

13. The nonvolatile memory device of claim 11, wherein the insulating spacer includes protrusions which respectively penetrate into the second semiconductor layers between the insulating layers and contact the common source line.

14. The nonvolatile memory device of claim 7, wherein the second semiconductor layers are P-doped polysilicon.

15. The nonvolatile memory device of claim 14, wherein the first semiconductor layer is N-doped polysilicon.

16. A nonvolatile memory device comprising:
a substrate; a first semiconductor layer on the substrate;
an etching stop film including a metal oxide on the first semiconductor layer;
a mold structure including second semiconductor layers and insulating layers alternately stacked on the etching stop film;
a common source line which penetrates the mold structure, the etching stop film and the first semiconductor layer in a first direction, and includes conductive materials;
a channel hole which penetrates the mold structure, the etching stop film, the first semiconductor layer and the substrate;
a channel structure which extends along a side wall of the channel hole, includes an anti-oxidant film, a first blocking insulation film, a second blocking insulation film, a charge storage film, a tunnel insulating film, a channel semiconductor and a filling pattern sequentially disposed on the side wall of the channel hole, and includes a channel pad on the channel semiconductor and the filling pattern;
an insulating spacer formed between the mold structure and the common source line, between the etching stop film and the common source line, and between the first semiconductor layer and the common source line;
a bit line contact electrically connected to the channel pad;
an interlayer insulating film which surrounds the bit line contact; and
a bit line disposed on the interlayer insulating film and electrically connected to the bit line contact,
wherein the insulating spacer does not contact the first semiconductor layer,
wherein the anti-oxidant film is in contact with the second semiconductor layers,
wherein the second semiconductor layers are polysilicon,
wherein the first semiconductor layer penetrates the anti-oxidant film in a second direction intersecting the first direction, and directly contacts the first blocking insulation film, the second blocking insulation film, the charge storage film, and the tunnel insulating film,
wherein the channel semiconductor does not contact the anti-oxidant film, and
wherein the first semiconductor layer penetrates the first blocking insulation film, the second blocking insulation film, the charge storage film, and the tunnel insulating film and is electrically connected to the channel semiconductor, and wherein the anti-oxidant film is AlN.

17. The nonvolatile memory device of claim 16, wherein the metal oxide is $HfO_2$.

18. The nonvolatile memory device of claim 16, wherein the insulating spacer includes protrusions which respectively penetrate into the second semiconductor layers between the insulating layers and contact the common source line.

* * * * *